United States Patent
Hwang et al.

(10) Patent No.: US 9,306,583 B2
(45) Date of Patent: Apr. 5, 2016

(54) DELAY LOCKED LOOP, METHOD OF OPERATING THE SAME, AND MEMORY SYSTEM INCLUDING THE SAME

(71) Applicant: SAMSUNG ELECTRONICS CO., LTD., Suwon-si, Gyeonggi-do (KR)

(72) Inventors: Soon Suk Hwang, Ansan-si (KR); Youngjin Cho, Seoul (KR); Kyuwook Han, Seoul (KR); Jaegeun Park, Seoul (KR)

(73) Assignee: SAMSUNG ELECTRONICS CO., LTD., Suwon-Si, Gyeonggi-Do (KR)

( * ) Notice: Subject to any disclaimer, the term of this patent is extended or adjusted under 35 U.S.C. 154(b) by 0 days.

(21) Appl. No.: 14/638,363

(22) Filed: Mar. 4, 2015

(65) Prior Publication Data
US 2015/0256187 A1 Sep. 10, 2015

(30) Foreign Application Priority Data
Mar. 4, 2014 (KR) .................. 10-2014-0025606

(51) Int. Cl.
*G11C 7/00* (2006.01)
*H03L 7/08* (2006.01)
*H03L 7/085* (2006.01)
*G11C 7/22* (2006.01)

(52) U.S. Cl.
CPC ............ *H03L 7/0802* (2013.01); *G11C 7/22* (2013.01); *H03L 7/085* (2013.01)

(58) Field of Classification Search
CPC ........................................................ G11C 7/00
USPC ............................... 365/189.011–225.7
See application file for complete search history.

(56) References Cited

U.S. PATENT DOCUMENTS

| | | | |
|---|---|---|---|
| 6,342,796 B2 | 1/2002 | Jung | |
| 6,549,041 B2 | 4/2003 | Waldrop | |
| 6,791,381 B2 | 9/2004 | Stubbs et al. | |
| 6,853,226 B2 | 2/2005 | Kwak et al. | |
| 6,937,530 B2 * | 8/2005 | Bell | G11C 7/22 327/158 |
| 7,098,712 B2 | 8/2006 | Lee | |
| 7,149,145 B2 * | 12/2006 | Kim | H03L 7/0812 327/141 |
| 7,245,540 B2 * | 7/2007 | Jones | G11C 7/222 365/197 |
| 7,701,274 B2 | 4/2010 | Chae | |
| 7,701,802 B2 * | 4/2010 | Vergnes | G11C 29/02 365/189.07 |

(Continued)

FOREIGN PATENT DOCUMENTS

JP 2008-172574 7/2008
KR 1020090017154 2/2009

*Primary Examiner* — Harry W Byrne
(74) *Attorney, Agent, or Firm* — F. Chau & Associates, LLC

(57) ABSTRACT

A delay locked loop (DLL) is provided. The DLL includes a delay line, a phase detector, a delay line control unit, and a DLL controller. The delay line outputs an output clock by delaying an input clock by a first time on the basis of a select value. The phase detector detects a phase of the output clock. The delay line control unit determines a select value so that the first time corresponds to n periods of the input clock on the basis of the detected phase and an initial select value. The DLL controller provides the initial select value to the delay line control unit. The DLL controller updates the initial select value according to a change of a frequency of the input clock, and to provide the updated initial select value to the delay line control unit.

20 Claims, 20 Drawing Sheets

(56) References Cited

U.S. PATENT DOCUMENTS

| | | |
|---|---|---|
| 7,737,746 B2 | 6/2010 | Shin |
| 7,741,891 B2 | 6/2010 | Kim |
| 8,237,478 B2 | 8/2012 | Yun et al. |
| 8,451,970 B2 | 5/2013 | Kim et al. |
| 2002/0181297 A1* | 12/2002 | Jones .................. G11C 7/222 365/194 |
| 2005/0052910 A1* | 3/2005 | Bell .................... G11C 7/22 365/194 |
| 2006/0023562 A1* | 2/2006 | Kim ................... H03L 7/0812 365/233.1 |
| 2006/0087908 A1* | 4/2006 | Kim ................... H03L 7/0812 365/194 |
| 2007/0279111 A1 | 12/2007 | Maeda et al. |
| 2009/0244995 A1* | 10/2009 | Searles ............... G11C 7/1051 365/194 |
| 2010/0246294 A1* | 9/2010 | Chuang ............... G11C 7/22 365/194 |

\* cited by examiner

DELAY LOCKED LOOP, METHOD OF OPERATING THE SAME, AND MEMORY SYSTEM INCLUDING THE SAME

CROSS-REFERENCE TO RELATED APPLICATION

This application claims priority under 35 U.S.C. §119 to Korean Patent Application No. 10-2014-0025606, filed on Mar. 4, 2014, in the Korean Intellectual Property Office, the disclosure of which is incorporated by reference herein in its entirety.

TECHNICAL FIELD

The present inventive concept relates to a memory system, and more particularly, to a delay locked loop, a method of operating the same, and a memory system including the same.

DISCUSSION OF THE RELATED ART

A semiconductor memory device operates based on an operation clock, for example, a data strobe signal DQS. The semiconductor memory device may include a delay locked loop (DLL) to generate the operation clock. For example, semiconductor memories affiliated with double data rate (DDR) may capture a command, an address, and data using the data strobe signal DQS.

The DLL delays an input clock using a plurality of delay cells to generate an output clock. To this end, the DLL performs a locking operation on the delayed input clock to generate the output clock. As a locking time of the DLL increases, power consumption of the semiconductor memory may be increased and thus, overall performance thereof may be decreased.

SUMMARY

An exemplary embodiment of the present inventive concept provides a delay locked loop that adjusts an initial select value in accordance with a frequency of an operating clock.

According to an exemplary embodiment of the present inventive concept, a delay locked loop is provided. The delay locked loop includes a delay line, a phase detector, a delay line control unit, and a delay locked loop controller. The delay line is configured to output an output clock by delaying an input clock by a first time on the basis of a select value. The phase detector is configured to detect a phase of the output clock. The delay line control unit is configured to determine the select value so that the first time corresponds to n periods on the basis of the detected phase and an initial select value, wherein n is a positive integer. The delay locked loop controller is configured to provide the initial select value to the delay line control unit. The delay locked loop controller is configured to update the initial select value according to a change of a frequency of the input clock, and to provide the updated initial select value to the delay line control unit, and to provide the updated initial select value to the delay line control unit. The delay line control unit is configured to determine the select value on the basis of the updated initial select value.

In an exemplary embodiment of the present inventive concept, the delay line control unit may be configured to change the select value when the first time does not correspond to the n periods of the input clock.

In an exemplary embodiment of the present inventive concept, the delay line may be configured to delay the input clock on the basis of the changed select value, and to output the output clock.

In an exemplary embodiment of the present inventive concept, the delay line control unit may be configured to set the determined select value as a locked value, and to transmit the set locked value to the delay locked loop controller.

In an exemplary embodiment of the present inventive concept, the delay locked loop controller may include a storage circuit and a calculating unit. The storage circuit may be configured to store the locked value and the initial select value. The calculating unit may be configured to generate the updated initial select value according to the frequency change of the input clock and the locked value.

In an exemplary embodiment of the present inventive concept, the updated initial select value may be stored in the storage circuit.

In an exemplary embodiment of the present inventive concept, the delay line control unit may be configured to determine the select value on the basis of the updated initial select value in the storage circuit, the initial select value in the storage circuit, and the frequency of the input clock.

According to an exemplary embodiment of the present inventive concept, a method of operating a delay locked loop is provided. The method includes outputting a first output clock by delaying a first input clock having a first frequency by n periods of the first input clock on the basis of a first initial select value, wherein n is a positive integer, determining a second initial select value on the basis of the first frequency and a second frequency when the first input clock is changed to a second input clock having the second frequency, and outputting a second output clock by delaying the second input clock having by m periods of the second input clock on the basis of the second initial select value, where m is a positive integer.

In an exemplary embodiment of the present inventive concept, the outputting a first output clock by delaying a first input clock may include setting the first initial select value to a first select value, outputting the first output clock on the basis of the set first select value, detecting a phase of the first output clock, adjusting the first select value so that a phase difference between the first input clock and the first output clock corresponds to the n period of the first input clock on the basis of the detected phase, and outputting the first output clock on the basis of the adjusted first select value.

In an exemplary embodiment of the present inventive concept, the outputting a first output clock by delaying a first input clock may further include setting the adjusted first select value to a first locked value and storing the set first locked value in a storage circuit.

In an exemplary embodiment of the present inventive concept, the determining a second initial select value on the basis of the first and second frequencies may further include the second initial select value on the basis of a ratio of the first and second frequencies and the first locked value.

In an exemplary embodiment of the present inventive concept, the determining a second initial select value on the basis of the first and second frequencies may further include applying an offset value to the second initial select value so that a phase difference between the second output clock and the second input clock does not exceed the one period of the second input clock.

In an exemplary embodiment of the present inventive concept, the second initial select value may be determined to be greater than the first initial select value when the first frequency is higher than the second frequency, and the second initial select value may be determined to be smaller than the first initial select value first frequency is lower than the second frequency.

In an exemplary embodiment of the present inventive concept, the determining a second initial select value on the basis of the first and second frequencies may further include storing the second initial select value in the storage circuit.

In an exemplary embodiment of the present inventive concept, the outputting a second output clock by delaying a second input clock may include setting the second initial select value to a second select value, outputting the second output clock on the basis of the set second select value, detecting a phase of the second output clock, adjusting the second select value so that a phase difference between the second input clock and the second output clock corresponds to the m periods of the second input clock on the basis of the detected phase, and outputting the second output clock on the basis of the adjusted second select value.

According to an exemplary embodiment of the present inventive concept, a memory system is provided. The system includes a memory device and a memory controller. The memory device is configured to store data and the memory controller is configured to control the memory device. The memory controller includes a first delay locked loop, and the memory device includes a second delay locked loop. The first delay locked loop is configured to generate a first clock, and to transmit the first clock to the memory device. The second delay locked loop is configured to receive the first clock, to generate a second clock on the basis of the received first clock, and to transmit the second clock to the memory controller. At least one of the first and second delay locked loops includes a delay line, a delay line control unit, and a delay locked loop controller. The delay line is configured to output an output clock by delaying an input clock by a first time on the basis of a select value. The delay line control unit is configured to determine whether the first time corresponds to n periods of the input clock, and to provide the select value to the delay line on the basis of an initial select value, wherein n is a positive integer. The delay locked loop controller is configured to provide the initial select value to the delay line control unit. The delay locked loop controller is configured to update the initial select value when a frequency of the input clock is changed from a first frequency to a second frequency, and to provide the updated initial select value to the delay line control unit. The delay line control unit is configured to determine the select value on the basis of the updated initial select value.

In an exemplary embodiment of the present inventive concept, the delay line control unit may be configured to set the select value as a locked value and to provide the locked value to the delay locked loop controller when the first time is determined to be the n periods of the input clock. The delay line control unit may be configured to adjust the select value when the first time is determined to be different from the n periods of the input clock.

In an exemplary embodiment of the present inventive concept, the delay line may include a plurality of delay cells configured to activate based on the select value. The input clock may be delayed by the activated delay cells.

In an exemplary embodiment of the present inventive concept, the delay locked loop controller may be configured to update the initial select value on the basis of a ratio of the first and second frequencies.

In an exemplary embodiment of the present inventive concept, the delay locked loop controller may be configured to increase the initial select value when the first frequency is higher than the second frequency. The delay locked loop controller may be configured to decrease the initial select value when the first frequency is lower than the second frequency.

BRIEF DESCRIPTION OF THE DRAWINGS

The above and other features of the present inventive concept will become more apparent by describing in detail exemplary embodiments thereof with reference to the accompanying drawings in which.

DETAILED DESCRIPTION OF THE EXEMPLARY EMBODIMENTS

Figure 1:
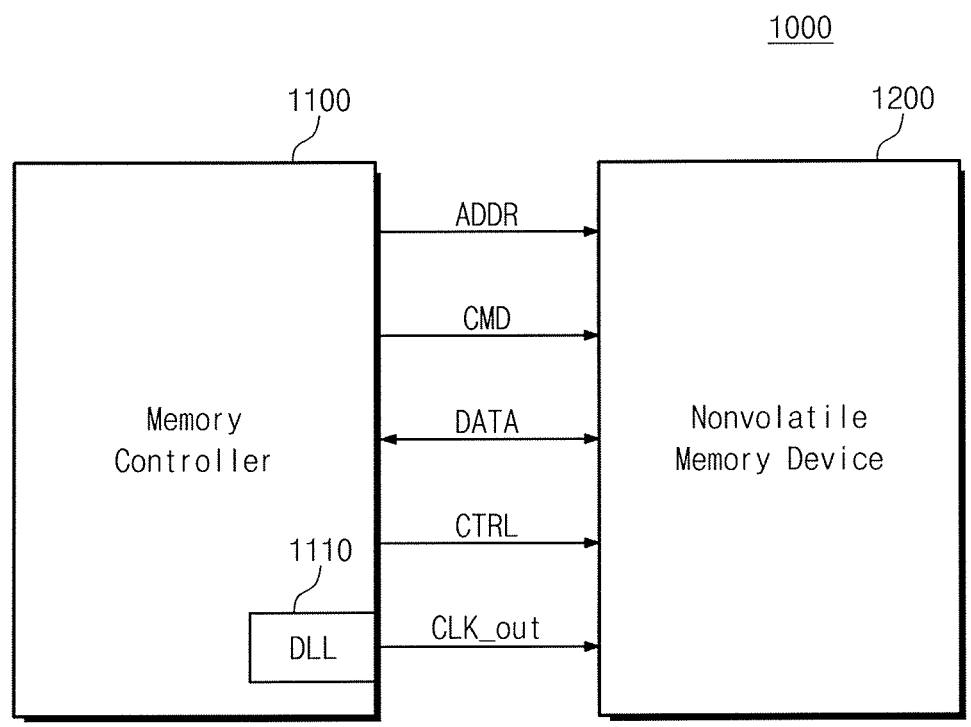
FIG. 1 is a block diagram illustrating a nonvolatile memory system in accordance with an exemplary embodiment of the present inventive concept.

Hereinafter, exemplary embodiments of the present inventive concept will be described more fully with reference to the accompanying drawings. Like reference numerals may refer to like elements throughout the specification and drawings.

As used herein, the singular forms "a", "an" and "the" are intended to include the plural forms as well, unless the context clearly indicates otherwise.

It will be understood that when an element or layer is referred to as being "on", "connected to", "coupled to", or "adjacent to" another element or layer, it may be directly on, connected, coupled, or adjacent to the other element or layer, or intervening elements or layers may be present.

A delay locked loop (DLL) in accordance with an exemplary embodiment of the present inventive concept may update an initial delay value on the basis of a frequency of an input clock. Thus, a locking time and power consumption of the DLL may be reduced. The DLL in accordance with an exemplary embodiment of the present inventive concept may be included in a nonvolatile memory system that supports dynamic frequency scaling (DFS). According to an exemplary embodiment of the present inventive concept, a DLL having increased performance and reduced power consumption, a method of operating the DLL, and a nonvolatile memory system including the DLL are provided.

FIG. 1 is a block diagram illustrating a nonvolatile memory system in accordance with an exemplary embodiment of the present inventive concept. Referring to FIG. 1, a nonvolatile memory system 1000 includes a memory controller 1100 and a nonvolatile memory device 1200. The memory controller 1100 may transmit an address ADDR, a command CMD, and a control signal CTRL to the nonvolatile memory device 1200. The memory controller 1100 may exchange data DATA with the nonvolatile memory device 1200.

The memory controller 1100 may include a DLL 1110. The DLL 1110 receives a clock (e.g., an operation clock, an internal clock, etc.) generated from the inside of the memory controller 1100 and delays the received clock by n periods (e.g., one period) of the input clock to output an output clock CLK_out, where n is a positive integer. The output clock CLK_out may be transmitted to the nonvolatile memory device 1200.

The nonvolatile memory device 1200 may receive the address ADDR, the command CMD, and the control signal CTRL from the memory controller 1100. The nonvolatile memory device 1200 may exchange data DATA with the memory controller 1100. In response to the address ADDR, the command CMD, and the control signal CTRL, the nonvolatile memory device 1200 may write data DATA received from the memory controller 1100, transmit data DATA stored in the nonvolatile memory device 1200 to the memory controller 1100, or erase memory blocks included in the nonvolatile memory device 1200.

The nonvolatile memory device 1200 may receive the output clock CLK_out from the memory controller 1100 and use the received output clock CLK_out as a data strobe signal (DQS). For example, the nonvolatile memory device 1200 may exchange data DATA with the memory controller 1100 through data lines. The nonvolatile memory device 1200 may distinguish data DATA received through the data lines on the basis of the output clock CLK_out or transmit data DATA to the memory controller 1100 via the data lines on the basis of the output clock CLK_out.

Figure 2:
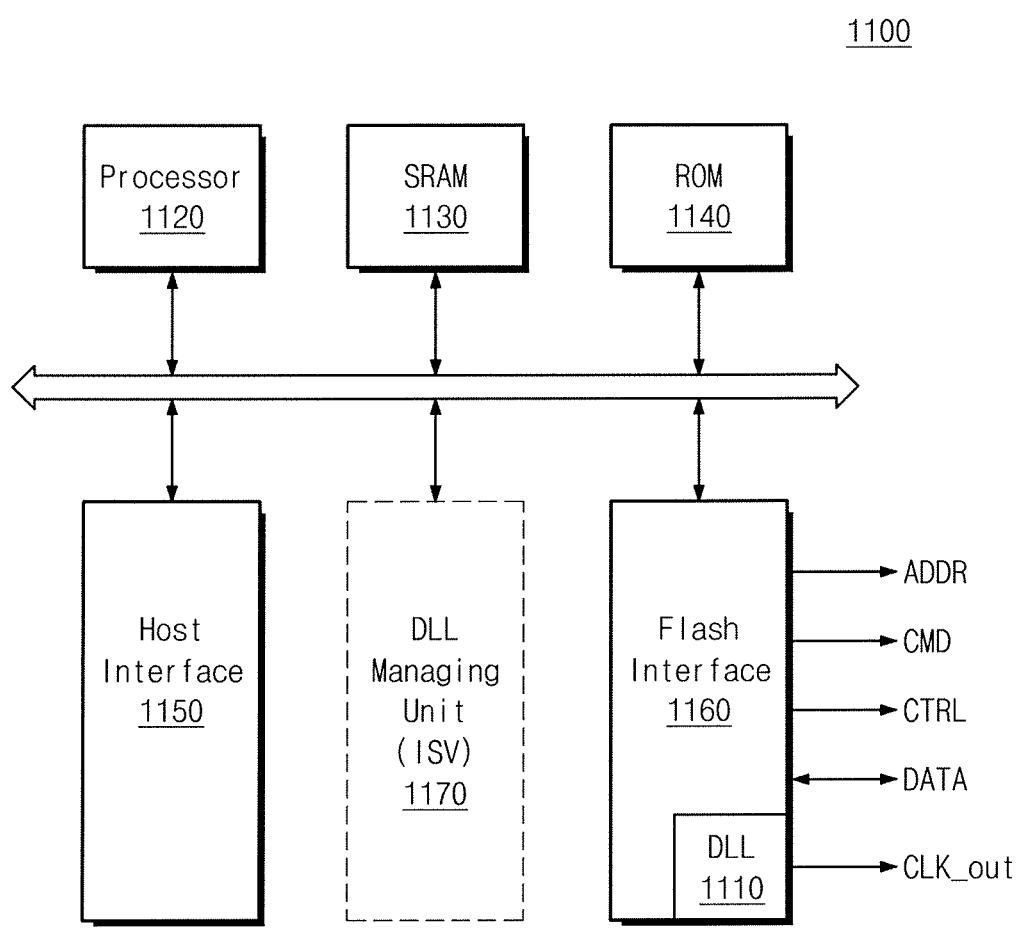
FIG. 2 is a block diagram illustrating a memory controller of FIG. 1 in accordance with an exemplary embodiment of the present inventive concept.

FIG. 2 is a block diagram of a memory controller of FIG. 1 in accordance with an exemplary embodiment of the present inventive concept. Referring to FIGS. 1 and 2, the memory controller 1100 includes a processor 1120, a static random-access memory (SRAM) 1130, a read-only memory (ROM) 1140, a host interface 1150, a flash interface 1160, and a DLL managing unit 1170.

The processor 1120 may control an operation of the memory controller 1100. The SRAM 1130 may be used as a buffer memory, an operation memory, a cache memory, or a main memory of the memory controller 1100. The ROM 1140 may store various information required for an operation of the memory controller 1100 in firmware.

The memory controller 1100 may communicate with a host through the host interface 1150. The host interface 1150 may provide an interface between the memory controller 1100 and the host on the basis of various interfaces such as a universal serial bus (USB), a peripheral component interconnection (PCI), a PCI-express (PCI-E), an advanced technology attachment (ATA), a serial-ATA (SATA), a parallel-ATA (PATA), a small computer small interface (SCSI), an enhanced small disk interface (ESDI), an integrated drive electronics (IDE), a mobile industry processor interface (MIPI), a nonvolatile memory-express (NVMe), and so on.

The flash interface 1160 may include the DLL 1110. The DLL 1110 may receive an operation clock to be used in the memory controller 1100 and delay the received operation clock by n periods (e.g., one period) to generate an output clock CLK_out. The output clock CLK_out is transmitted to the nonvolatile memory device 1200.

For example, the DLL managing unit 1170 may provide an initial select value ISV to the DLL 1110. The DLL 1110 may perform a locking operation on the basis of the initial select value ISV. In an exemplary embodiment of the present inventive concept, the DLL managing unit 1170 may be provided in of software. In an exemplary embodiment of the present inventive concept, the DLL managing unit 1170 may be stored in the ROM 1140 in firmware and may be driven by the processor 1120. In an exemplary embodiment of the present inventive concept, the DLL managing unit 1170 may be stored in the SRAM 1130 and may be driven by the processor 1120.

The initial select value ISV indicates the number of initially activated delay cells of a delay line in the DLL 1110 when the DLL 1110 performs a locking operation. The locking operation is an operation in which the DLL 1110 searches delay cells to be activated to generate an output clock CLK_out so that a phase difference between the output clock CLK_out and an input clock CLK_in becomes n periods (e.g., one period) of the input clock CLK_in or the output clock CLK_out.

Figure 3:
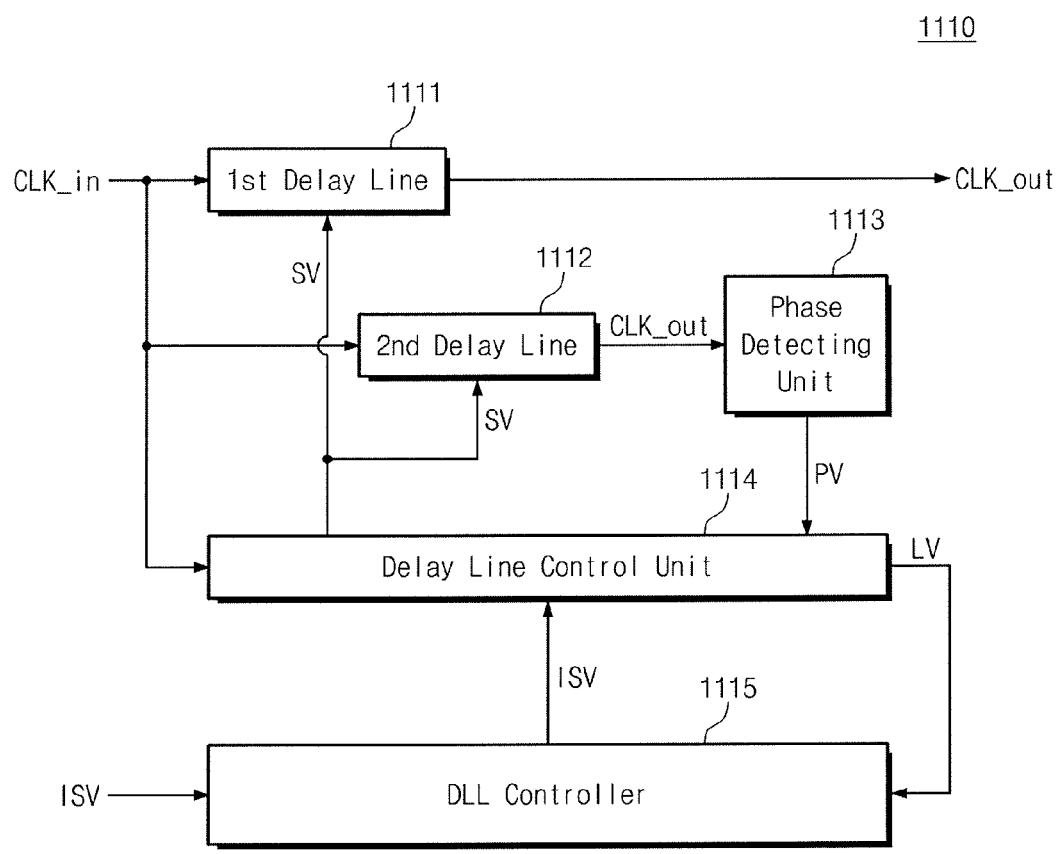
FIG. 3 is a block diagram illustrating a delay locked loop (DLL) of FIG. 2 in accordance with an exemplary embodiment of the present inventive concept.

FIG. 3 is a block diagram illustrating a DLL of FIG. 2 in accordance with an exemplary embodiment of the present inventive concept. For ease of description, it will be assumed that the DLL 1110 receives an input clock CLK_in and delays the received input clock CLK_in by n periods (e.g., one period) to generate an output clock CLK_out. In addition, it will be assumed that the input clock CLK_in is an operation clock of the nonvolatile memory system 1000. However, the present inventive concept is not limited thereto.

Referring to FIGS. 2 and 3, the DLL 1110 includes first and second delay lines 1111 and 1112, a phase detecting unit 1113, a delay line control unit 1114, and a DLL controller 1115.

The first and second delay lines 1111 and 1112 may output an output clock CLK_out obtained by delaying an input clock CLK_in by a predetermined time (e.g., one period of the input clock CLK_in). The first and second delay lines 1111 and 1112 receive the input clock CLK_in and delay the received input clock CLK_in. In addition, the first and second delay lines 1111 and 1112 may receive a select value SV from the delay line control unit 1114 and delay the input clock CLK_in on the basis of the received select value SV. The select value SV may indicate the number of delay cells to be activated among a plurality of delay cells included in the first and second delay lines 1111 and 1112.

The phase detecting unit 1113 may receive an output clock CLK_out output from the second delay line 1112 and detect a phase of the received output clock CLK_out. The phase detecting unit 1113 may transmit the detected phase value PV to the delay line control unit 1114.

The delay line control unit 1114 receives an initial select value ISV from the DLL controller 1115 and determines a select value SV on the basis of the received initial select value ISV. The delay line control unit 1114 may transmit the determined select value SV to the first and second delay lines 1111 and 1112. In an exemplary embodiment of the present inventive concept, the initial select value ISV indicates the number of initially activated delay cells of the first and second delay lines 1111 and 1112 when the DLL 1110 performs a locking operation.

The delay line control unit 1114 receives the input clock CLK_in and the phase value PV and compares the received input clock CLK_in with the received phase value PV to judge whether the output clock CLK_out is delayed by n periods (e.g., one period). In the case that the output clock CLK_out is not delayed by n periods (e.g., one period) with respect to the input clock CLK_in, the delay line control unit 1114 may reset the select value SV. For example, the delay line control unit 1114 may increase the select value SV by a predetermined value.

In the case that the output clock CLK_out is delayed by n periods (e.g., one period) with respect to the input clock CLK_in, the delay line control unit 1114 may set the select value SV as a locked value LV. The delay line control unit 1114 may transmit the locked value LV to the DLL controller 1115. In addition, the delay line control unit 1114 may control the first and second delay lines 1111 and 1112 on the basis of the locked value LV.

The DLL controller 1115 may receive the locked value LV from the delay line control unit 1114. The DLL controller 1115 may store the received locked value LV in a separate storage circuit (e.g., a register, a fuse, etc.). The DLL controller 1115 may receive the initial select value ISV from the DLL managing unit 1170. The DLL managing unit 1170 may transmit the received initial select value ISV to the delay line control unit 1114.

According to an exemplary embodiment of the present inventive concept, the DLL 1110 may determine a select value SV on the basis of an initial select value ISV and delay an input clock CLK_in on the basis of the determined select value SV to generate an output clock CLK_out. In addition, the DLL 1110 may compare the output clock CLK_out with the input clock CLK_in and control the select value SV according to a comparison result.

The DLL 1110 may generate an output clock CLK_out whose phase is delayed by n periods (e.g., one period) with respect to an input clock CLK_in by repeatedly performing the operation described above. The DLL 1110 may determine a select value SV so that an output clock CLK_out delayed by n periods (e.g., one period) with respect to an input clock CLK_in is generated and may store the determined select value SV as a locked value LV. An operation of the DLL 1110 described above is referred to as "a locking operation" or "a seeking operation".

A configuration of the DLL 1110 in accordance with an exemplary embodiment of the present inventive concept is not limited to the configuration illustrated in FIG. 3 and the first and second delay lines may be embodied by one delay line. The phase detecting unit 1113, the delay line control unit 1114, and the DLL controller 1115 may be embodied by one logic circuit.

Figure 4:
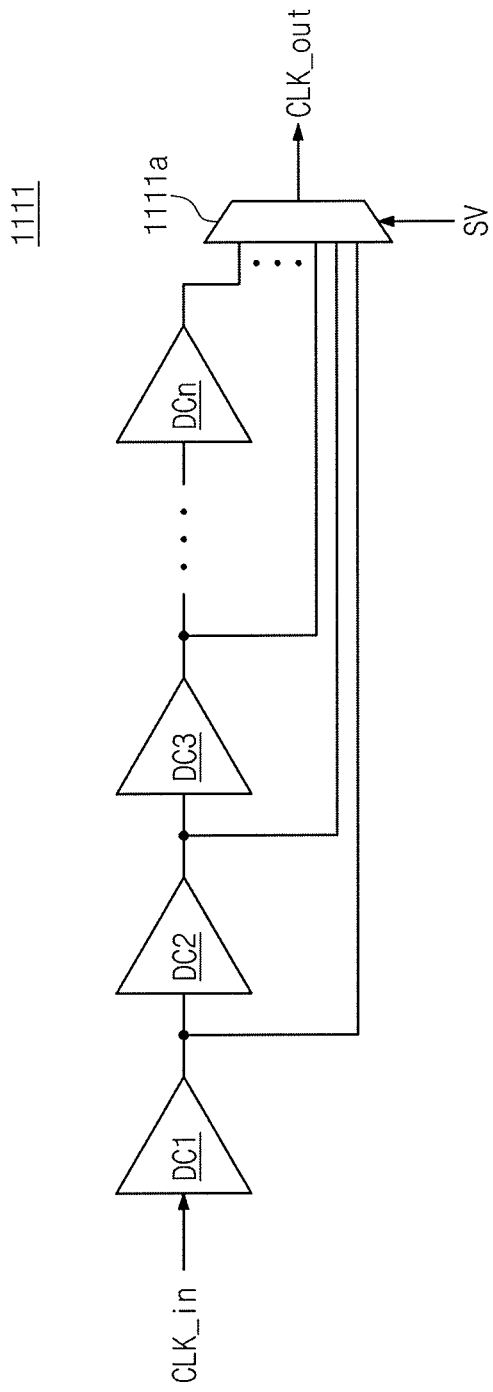
FIG. 4 is a block diagram illustrating a first delay line illustrated in FIG. 3 in accordance with an exemplary embodiment of the present inventive concept.

FIG. 4 is a block diagram illustrating a first delay line illustrated in FIG. 3 in accordance with an exemplary embodiment of the present inventive concept. For ease of description, the first delay line 1111 is described with reference to FIG. 4. However, the present inventive concept is not limited thereto and the second delay line 1112 may have the same configuration as the first delay line 1111 illustrated in FIG. 4. The configurations of the first and second delay lines 1111 and 1112 are not limited to the configuration illustrated in FIG. 4 and the first and second delay lines 1111 and 1112 may have various configurations.

Referring to FIGS. 3 and 4, the first delay line 1111 includes a plurality of delay cells DC1~DCn and a multiplexer 1111*a*. The delay cells DC1~DCn are serially connected to one another. Each of the delay cells DC1~DCn may delay an input signal (e.g., the input clock CLK_in) by a predetermined time to output the delayed input signal.

The multiplexer 1111*a* receives output signals of the delay cells DC1~DCn and a select value SV. The multiplexer 1111*a* may select one of the received output signals on the basis of the received select value SV to output the selected output signal as an output clock CLK_out. For example, the select value SV may indicate the number of delay cells to be activated among the delay cells DC1~DCn. For example, in the case that the select value SV indicates three delay cells, the multiplexer 1111*a* may select an output of the third delay cell DC3 to output the selected output as an output clock CLK_out.

The delay cells DC1~DCn may be activated or deactivated depending on the select value SV. For example, in the case that the select value SV indicates three delay cells, the first through third delay cells DC1~DC3 among the delay cells DC1~DCn are activated and the remaining delay cells DC4~DCn are deactivated.

For example, among the delay cells DC1~DCn, delay cells corresponding to the select value SV are activated and the remaining delay cells DC4~DCn are deactivated. The multiplexer 1111*a* selects one of the delay cells (e.g., DC1~DC3) corresponding to the select value SV to output the selected output as an output clock CLK_out.

Figure 5:
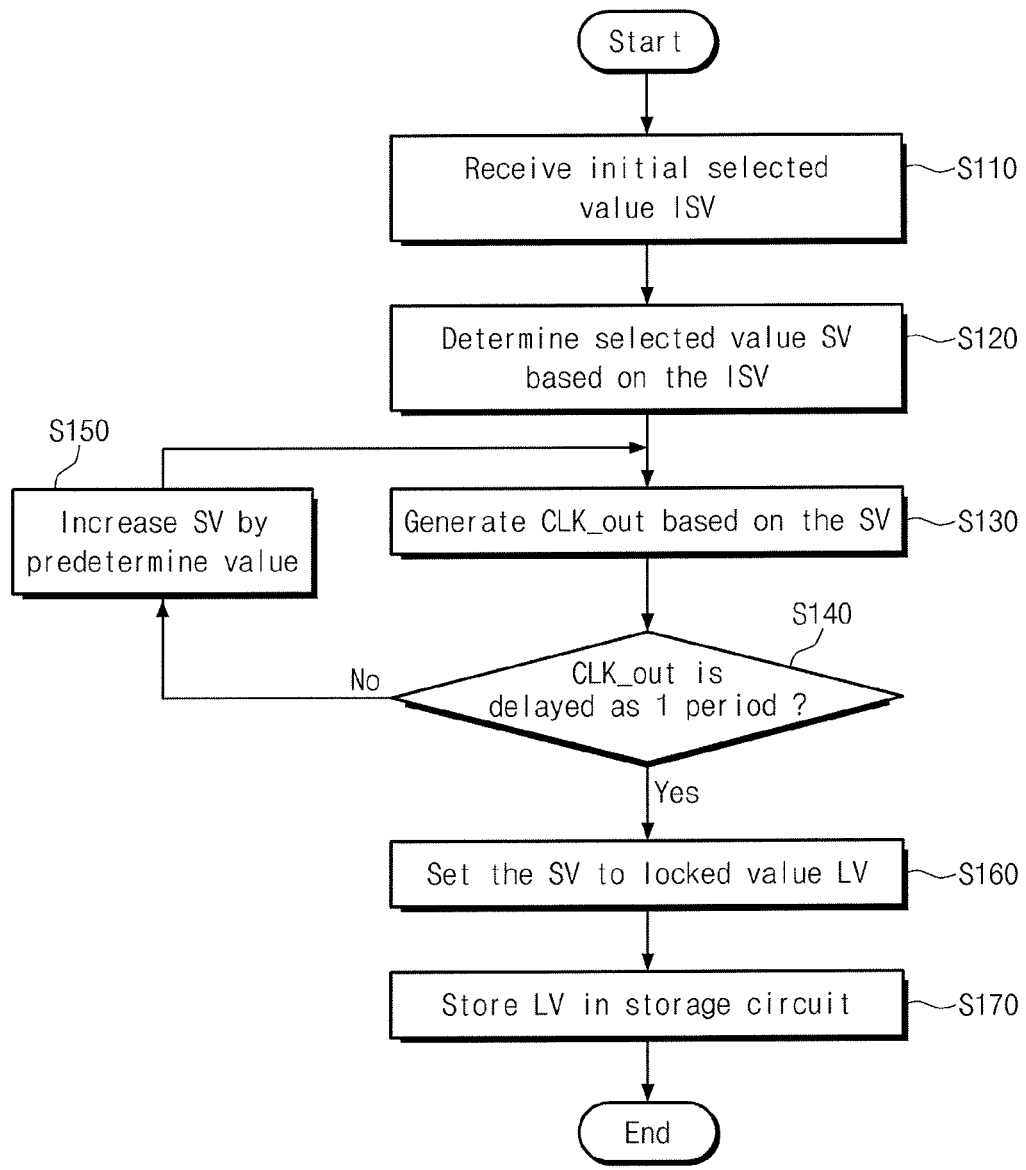
FIG. 5 is a flow chart illustrating an operation of a DLL illustrated in FIG. 3 in accordance with an exemplary embodiment of the present inventive concept.

FIG. 5 is a flow chart illustrating an operation of a DLL illustrated in FIG. 3 in accordance with an exemplary embodiment of the present inventive concept. Referring to FIGS. 2 through 4, in a step S110, the DLL 1110 may receive an initial select value ISV. For example, the initial select value ISV may be provided from the DLL managing unit 1170. In an exemplary embodiment of the present inventive concept, the initial select value ISV may be provided from the processor 1120 driving the DLL managing unit 1170.

In a step S120, the DLL 1110 may determine the select value SV on the basis of the received initial select value ISV. In an initial locking operation, the DLL 1110 may determine the select value SV on the basis of the received initial select value ISV.

In a step S130, the DLL 1110 may generate an output clock CLK_out on the basis of the select value SV. For example, the DLL 1110 may activate delay cells corresponding to the select value SV among a plurality of delay cells (e.g., DC1~DCn) included in the first and second delay lines 1111 and 1112. An input clock CLK_in is delayed by a predetermined time (e.g., one period) through the activated delay cells and is output as an output clock CLK_out.

In a step S140, the DLL 1110 may judge whether the output clock CLK_out is delayed by n periods (e.g., one period). For example, the DLL 1110 may detect a phase value PV of the output clock CLK_out. The DLL 1110 may compare the phase value PV of the output clock CLK_out with the input clock CLK_in.

In the case that the output clock CLK_out is not delayed by n periods (e.g., one period), the DLL 1110 may change the select value SV by a predetermined value. For example, the DLL 1110 may increase the select value SV by a predetermined value in a step S150. In addition, the DLL 1110 may increase the select value SV by repeatedly performing the steps S130 through S150. For example, the select value SV may be controlled so that the output clock CLK_out is delayed by n periods (e.g., one period). An operation of repeatedly performing the steps S130 through S150 may be a locking operation or a seeking operation.

In the case that the output clock CLK_out is delayed by n periods (e.g., one period), the DLL 1110 may set the select value SV as a locked value LV. In a step S170, the DLL 1110 may store the set locked value LV in a storage circuit.

Although not illustrated in FIG. 5, after storing the locked value LV, the DLL 1110 may generate an output clock CLK_out on the basis of the stored locked value LV. In the case that the output clock CLK_out is not delayed by n periods, the DLL 1110 may change the select value SV by a predetermined value. For example, in the case that the output clock CLK_out is delayed by more than one period, the DLL 1110 may reduce the select value SV by a predetermined value.

Figure 6:
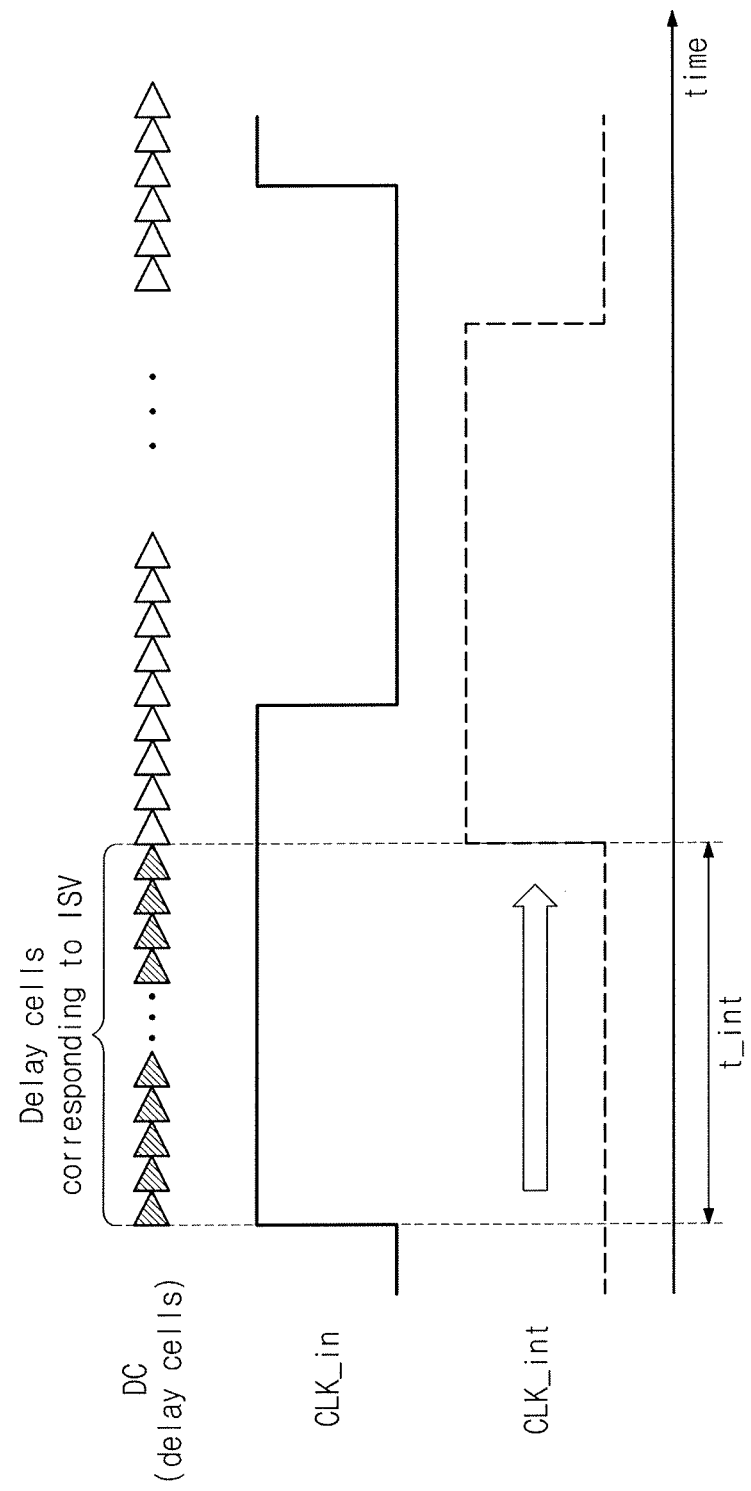
FIGS. 6 to 9 are diagrams for describing operations of a DLL illustrated in FIG. 3 in accordance with an exemplary embodiment of the present inventive concept.

FIGS. 6 to 9 are diagrams for describing an operation of a DLL illustrated in FIG. 3 in accordance with an exemplary embodiment of the present inventive concept. Referring to FIGS. 3 and 6, the DLL 1110 may delay an input clock CLK_in by an initial delay time tint to generate an initial delay clock CLK_int.

For example, the DLL 1110 may receive an initial select value ISV from the DLL managing unit 1170 and may set a select value SV on the basis of the received initial select value ISV. In an exemplary embodiment of the present inventive concept, the initial select value ISV may be the same as the select value SV. The DLL 1110 may generate an initial delay clock CLK_int by delaying the input clock CLK_in on the basis of the set select value SV. In this case, delay cells, corresponding to the select value SV, among the delay cells are activated. For example, the activated delay cells are delay cells corresponding to the initial select value ISV.

Figure 7:
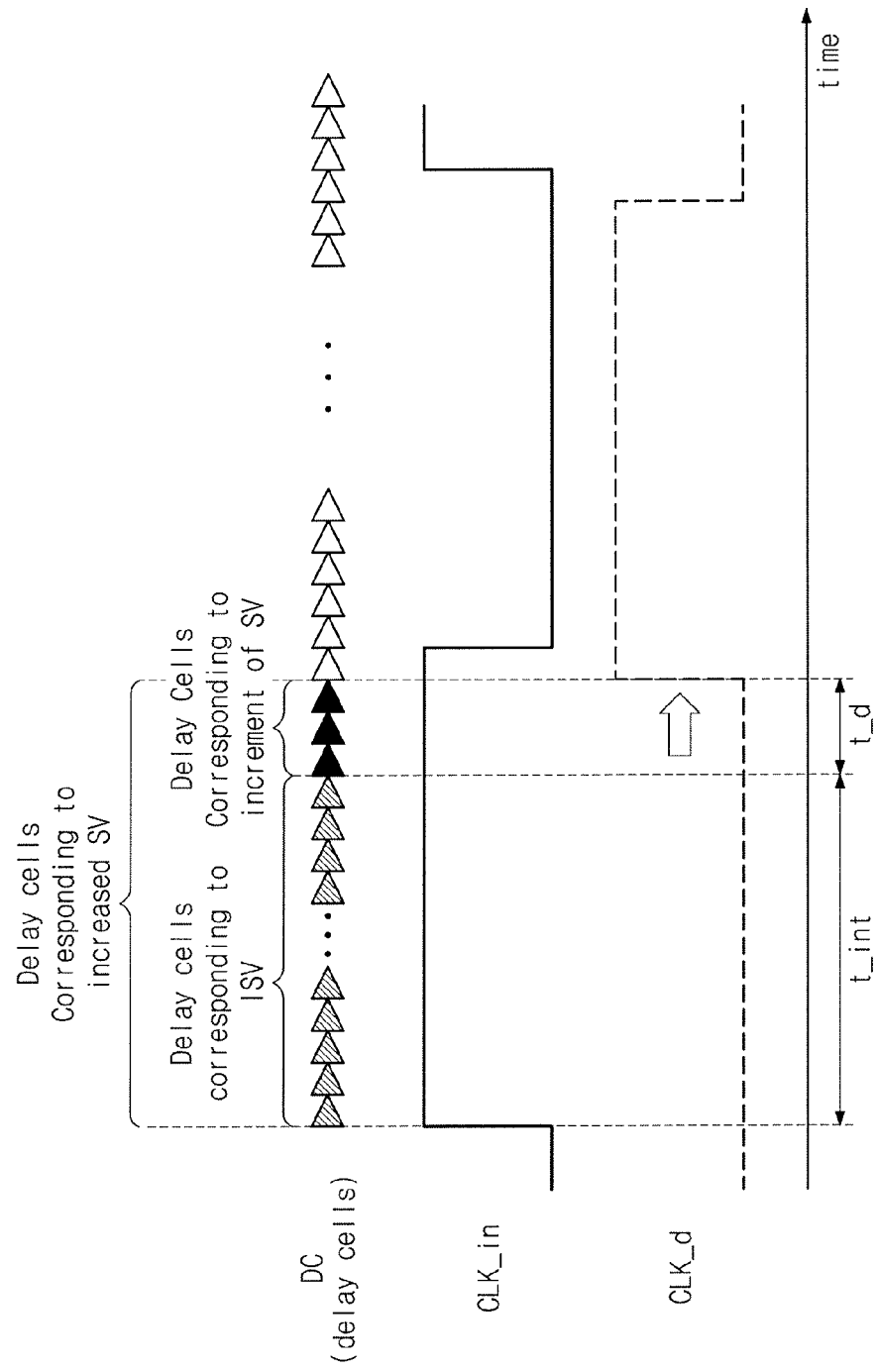

Referring to FIGS. 3 and 7, the DLL 1110 may detect a phase value PV of the generated initial delay clock CLK_int. The DLL 1110 may compare the detected phase value PV with the input clock CLK_in. As illustrated in FIG. 6, the initial delay clock CLK_int may not be delayed by n periods (e.g., one period) with respect to the input clock CLK_in. In this case, the DLL 1110 may increase the select value SV by a predetermined value.

The DLL 1110 may generate a delay clock CLK_d on the basis of the increased select value SV. For example, the DLL 1110 may activate delay cells, corresponding to the increment of the select value SV, among the delay cells. The initial clock CLK_int whose phase is delayed by the initial delay time tint with respect to the input clock CLK_in is further delayed by a delay time t_d using the activated delay cells. The delay time t_d may be a delay time caused by the delay cells corresponding to the increment of the select value SV.

For example, the DLL 1110 may further activate delay cells corresponding to the increment of the select value SV to generate the delay clock CLK_d on the basis of the activated delay cells.

Figure 8:
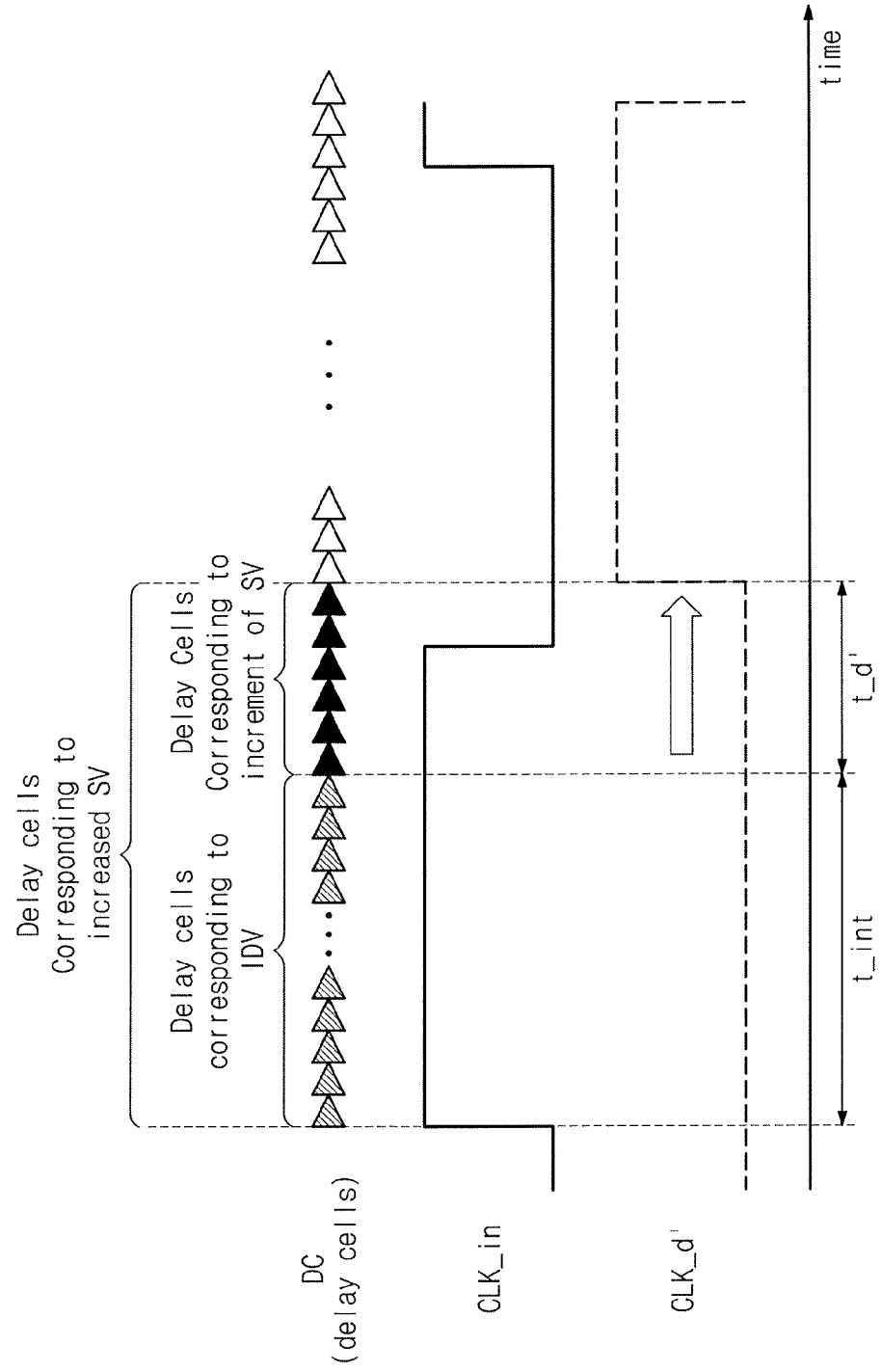

Referring to FIGS. 3 and 8, the DLL 1110 may detect a phase value PV of the generated delay clock CLK_d. The DLL 1110 may compare the detected phase value PV with the input clock CLK_in. As illustrated in FIG. 7, the delay clock CLK_d may not be delayed by n periods (e.g., one period) with respect to the input clock CLK_in. In this case, the DLL 1110 may increase the select value SV by a predetermined value.

The DLL 1110 may repeatedly perform the operation described with reference to FIGS. 7 and 8 so that a phase of the delay clock CLK_d is delayed by n periods (e.g., one period) with respect to a phase of the input clock CLK_in. A time required for repeatedly performing the operations described with reference to FIGS. 7 and 8 may be a locking time.

Figure 9:
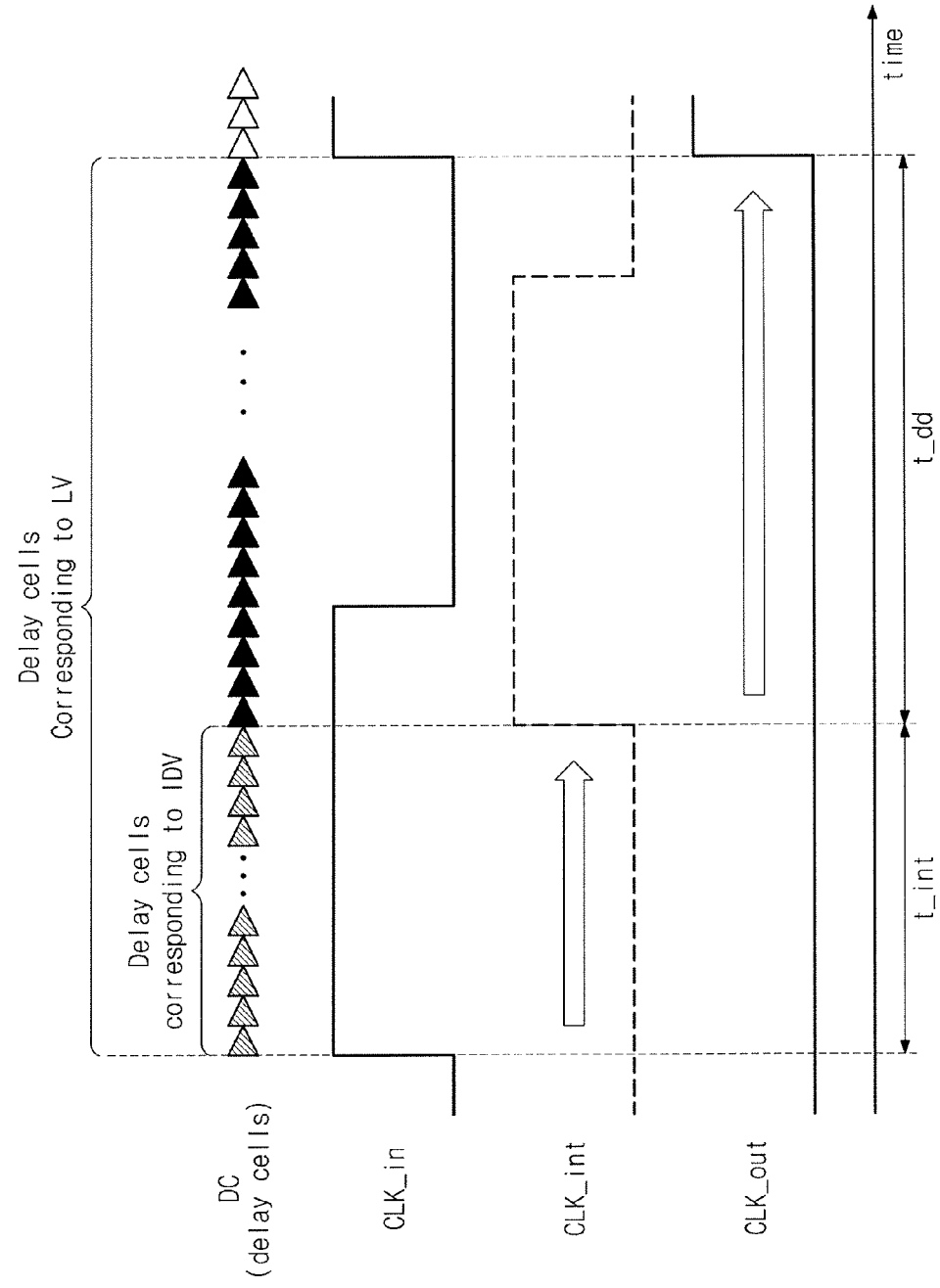

Referring to FIGS. 3 and 9, the DLL 1110 may generate an output clock CLK_out by delaying the input clock CLK_in by n periods (e.g., one period). For example, the DLL 1110 may control the select value SV by repeatedly performing the operation described with reference to FIGS. 7 and 8. In this case, the select value SV may be controlled so that the delay clock CLK_d is delayed by n periods (e.g., one period) with respect to the input clock CLK_in.

In the case that the delay clock CLK_d is delayed by n periods (e.g., one period) with respect to the input clock CLK_in, the DLL 1110 may set the controlled select value SV as a locked value LV. In addition, the DLL 1110 may activate a part of the delay cells on the basis of the set locked value LV.

For example, the output clock CLK_out may be a signal delayed by a delay time t_dd with respect to the initial delay clock CLK_int. For example, the DLL 1110 performs a seeking operation to seek the locked value LV for the delay time t_dd. For example, as the delay time t_dd increases, a locking time required to seek the locked value LV may increase.

Referring to FIG. 9, when the initial delay time tint increases, the delay time t_dd may be reduced and thus, a seeking time (or locking time) of the DLL 1110 may be reduced. For example, the number of delay cells corresponding to the increment of the select value SV may be reduced.

The initial select value ISV may be set in advance and thus, the seeking time (or locking time) may be reduced. The initial select value ISV set in advance may be stored in the DLL managing unit 1170. In an exemplary embodiment of the present inventive concept, the DLL managing unit 1170 may set the initial select value ISV so that the seeking time (or locking time) may be reduced.

Figure 10:
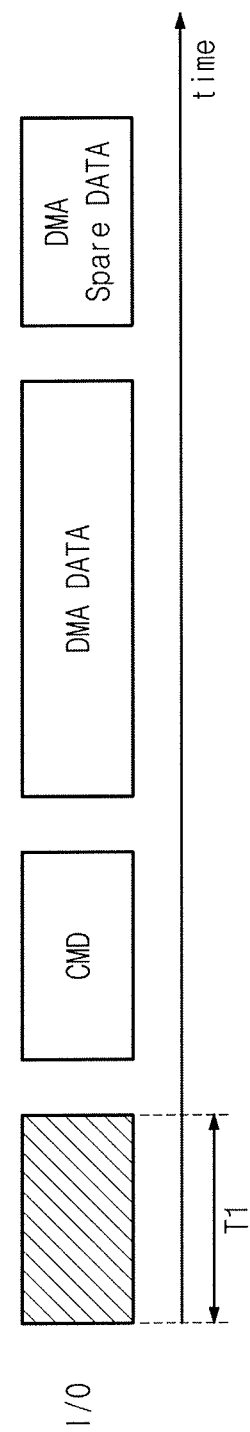
FIG. 10 is a diagram for describing an operation of a DLL in accordance with an exemplary embodiment of the present inventive concept.

FIG. 10 is a diagram for describing an operation of a DLL in accordance with an exemplary embodiment of the present inventive concept. Referring to FIGS. 1, 2 and 10, the memory controller 1100 and the nonvolatile memory device 1200 may perform a direct memory access (DMA) operation. The memory controller 1100 may sequentially transmit a command CMD, DMA data, and DMA spare data to the nonvolatile memory device 1200. The DMA operation is an operation of exchanging data without interference of the processor 1120. In this case, the DLL 1100 may perform a locking operation before transmitting the DMA command. After an output clock CLK_out is generated by the DLL 1110, the memory controller 1100 sequentially transmits the command CMD, the DMA data, and the DMA spare data to the nonvolatile memory device 1200.

For example, as a locking time T1 of the DLL 1110 is reduced, an operation speed of the nonvolatile memory system 1000 may be increased.

Figure 11:
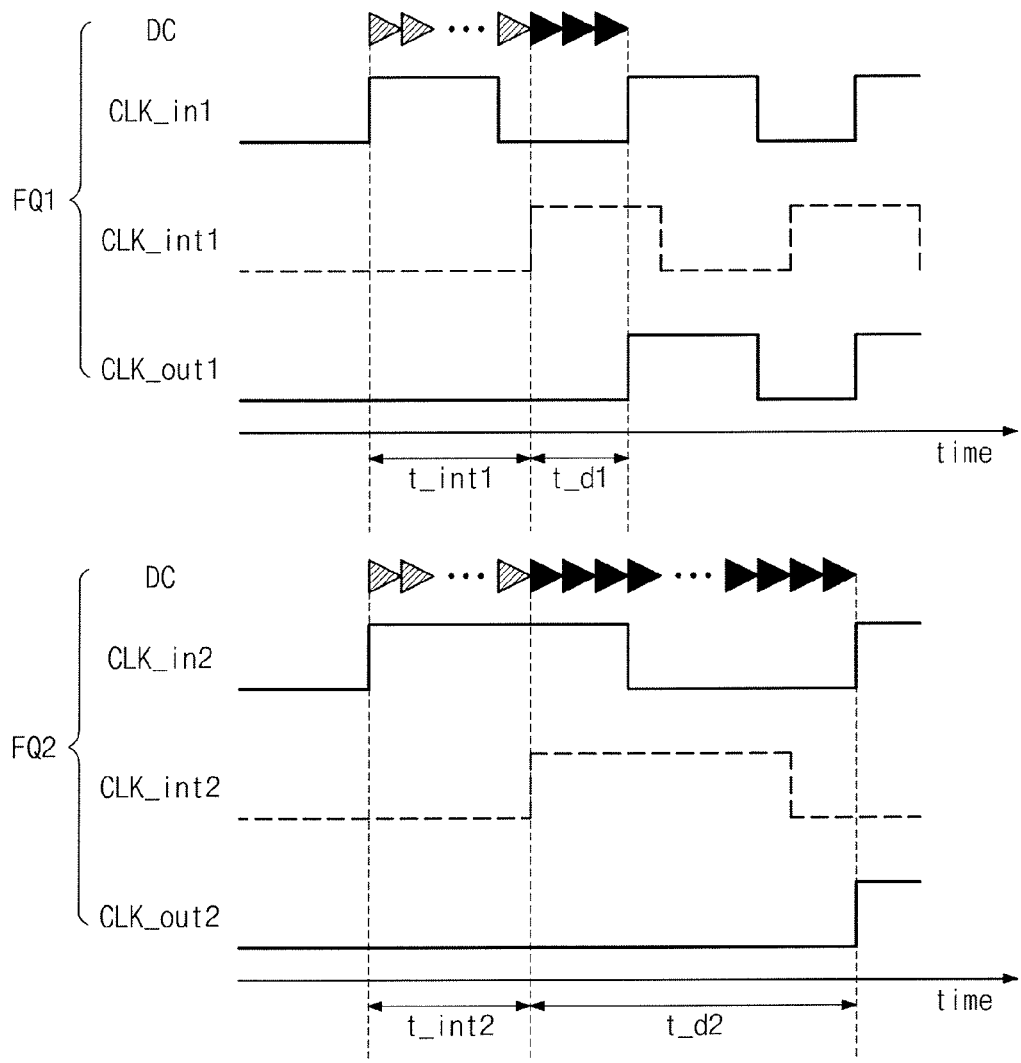
FIG. 11 is a diagram for explaining an operation of a DLL in accordance with an exemplary embodiment of the present inventive concept.

FIG. 11 is a diagram for explaining an operation of a DLL in accordance with an exemplary embodiment of the present inventive concept. Referring to FIGS. 1, 2, and 11, the nonvolatile memory system 1000 may support DFS operation.

For example, the nonvolatile memory system 1000 may operate based on a plurality of operation clocks.

For example, the nonvolatile memory system 1000 may operate based on a first input clock CLK_in1 having a first frequency FQ1. In this case, the DLL 1110 may activate delay cells, corresponding to the initial select value ISV, among the delay cells on the basis of the predetermined initial select value ISV. The first input clock CLK_in1 may be delayed by the initial delay time t_int1, for example, corresponding to the initial select value ISV, using the activated delay cells. In addition, the DLL 1110 may control the select value SV by repeatedly performing the operation described with reference to FIGS. 7 and 8. In this case, the select value SV may be controlled so that a first output clock CLK_out1 is delayed by n periods (e.g., one period) with respect to the first input clock CLK_in1.

The nonvolatile memory system 1000 may change a clock frequency to a second frequency FQ2 when operating based on the first input clock CLK_in1. For example, the nonvolatile memory system 1000 may operate based on a second input clock CLK_in2 having the second frequency FQ2. The second frequency FQ2 may be half of the first frequency FQ1. The DLL 1110 may activate delay cells, corresponding to the initial select value ISV, among the delay cells on the basis of the predetermined initial select value ISV. The second input clock CLK_in2 may be delayed by the initial delay time t_int2 using the activated delay cells. In addition, the DLL 1110 may control the select value SV by repeatedly performing the operation described with reference to FIGS. 7 and 8. In this case, the select value SV may be controlled so that a second output clock CLK_out2 is delayed by n periods (e.g., one period) with respect to the second input clock CLK_in2.

The first output clock CLK_out1 is a clock delayed by a first delay time t_d1 with respect to a first initial delay clock CLK_int1. The second output clock CLK_out2 is a clock delayed by a second delay time t_d2 with respect to a second initial delay clock CLK_int2.

As described with reference to FIG. 9, the first and second delay times t_d1 and t_d2 may correspond to locking times, respectively, with respect to the first and second output clocks CLK_out1 and CLK_out2. For example, when a frequency of the nonvolatile memory system 1000 is changed from the first frequency FQ1 to the second frequency FQ2 and the DLL 1110 operates based on the same initial select value ISV, a locking time of the DLL 1110 may be increased.

Figure 12:
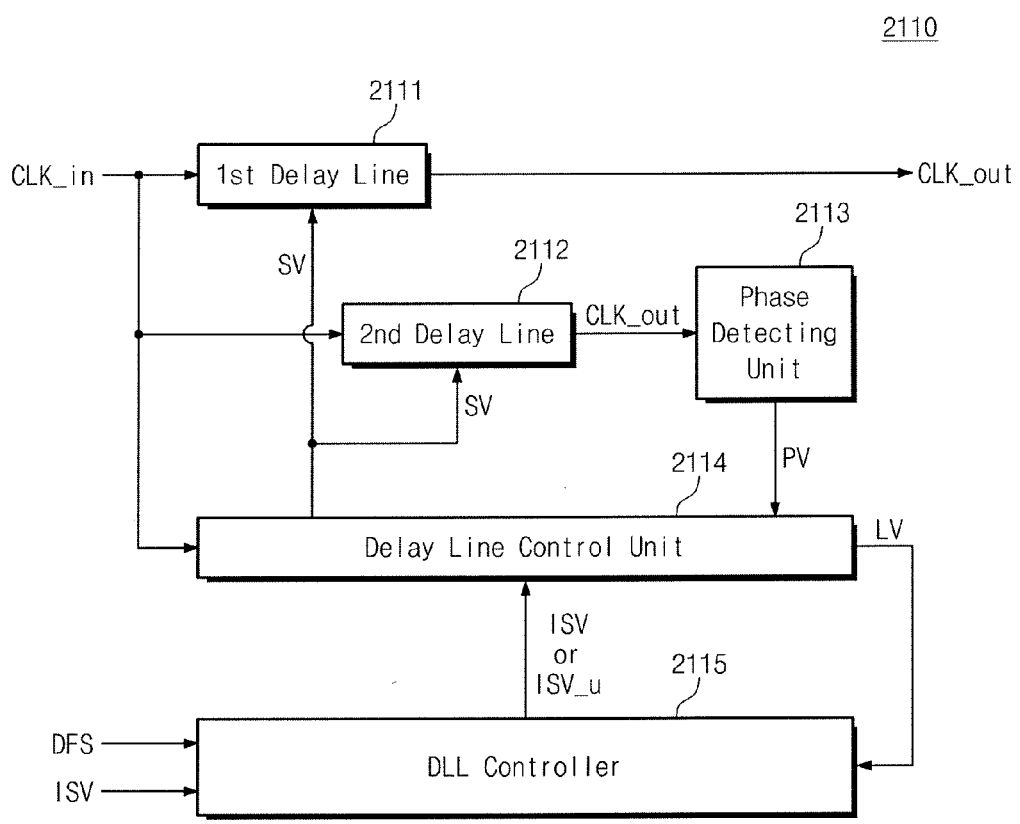
FIG. 12 is a block diagram illustrating a DLL in accordance with an exemplary embodiment of the present inventive concept.

FIG. 12 is a block diagram illustrating a DLL in accordance with an exemplary embodiment of the present inventive concept. Referring to FIG. 12, a DLL 2110 includes first and second delay lines 2111 and 2112, a phase detecting unit 2113, a delay line control unit 2114, and a DLL controller 2115. Since the first and second delay lines 2111 and 2112, the phase detecting unit 2113, and the delay line control unit 2114 are described with reference to FIGS. 3 and 4, overlapping descriptions will be omitted.

Unlike the DLL controller 1115 of FIG. 3, the DLL controller 2115 of FIG. 12 may further receive DFS information. The DFS information may be provided from the DLL managing unit 1170 (e.g., refer to FIG. 2). In an exemplary embodiment of the present inventive concept, the DFS information may be provided from the processor 1120 driving the DLL managing unit 1170.

The DLL controller 2115 may update an initial select value ISV on the basis of the received DFS information. For example, the DLL 2110 may delay an input clock CLK_in to generate an output clock CLK_out. In this case, a frequency of the input clock CLK_in may be changed. When the frequency of the input clock is changed, the changed frequency information of the input clock CLK_in may be included in the DFS information. The DLL controller 2115 may update the initial select value ISV on the basis of the DFS information and a locked value LV. The updated initial select value ISV_u may be expressed by a mathematical formula 1 as shown below.

$$ISV\_u = \frac{FQ1}{FQ2}LV - OFFSET \qquad \text{[mathematical formula 1]}$$

ISV_u indicates an updated initial select value, FQ1 indicates a frequency of an input clock CLK_in before being adjusted, FQ2 indicates a frequency of an input clock CLK_in after being adjusted, LV indicates a locked value with respect to an input clock CLK_in before being adjusted, and OFFSET indicates an offset value.

The offset value may be a value set so that a phase difference between an output clock CLK_out delayed by the updated initial select value ISV_u and the input clock CLK_in does not exceed one period. For example, in the case that the offset value is not applied, if a frequency of the input clock CLK_in is doubled, the updated initial select value ISV_u may be half of a locked value LV with respect to the input clock before being adjusted. In this case, the DLL 2110 may activate delay cells on the basis of the updated initial select value CLK_u (e.g., the half of the locked value LV corresponding to the input clock before being adjusted). Thus, a phase difference between the output clock CLK_out and the input clock CLK_in may become longer than one period by the delay cells activated due to the updated initial select value ISV_u.

Accordingly, an offset value having a predetermined value may be applied, as shown in mathematical formula 1, to obtain an updated initial select value ISV_u so that the phase difference between the output clock CLK_out and the input clock CLK_in is smaller than one period. For example, when delay cells are activated according to the updated initial select value ISV_u to which the offset value is applied, a phase difference between the output clock CLK_out and the input clock CLK_in by the activated delay cells may be smaller than one period.

Figure 13:
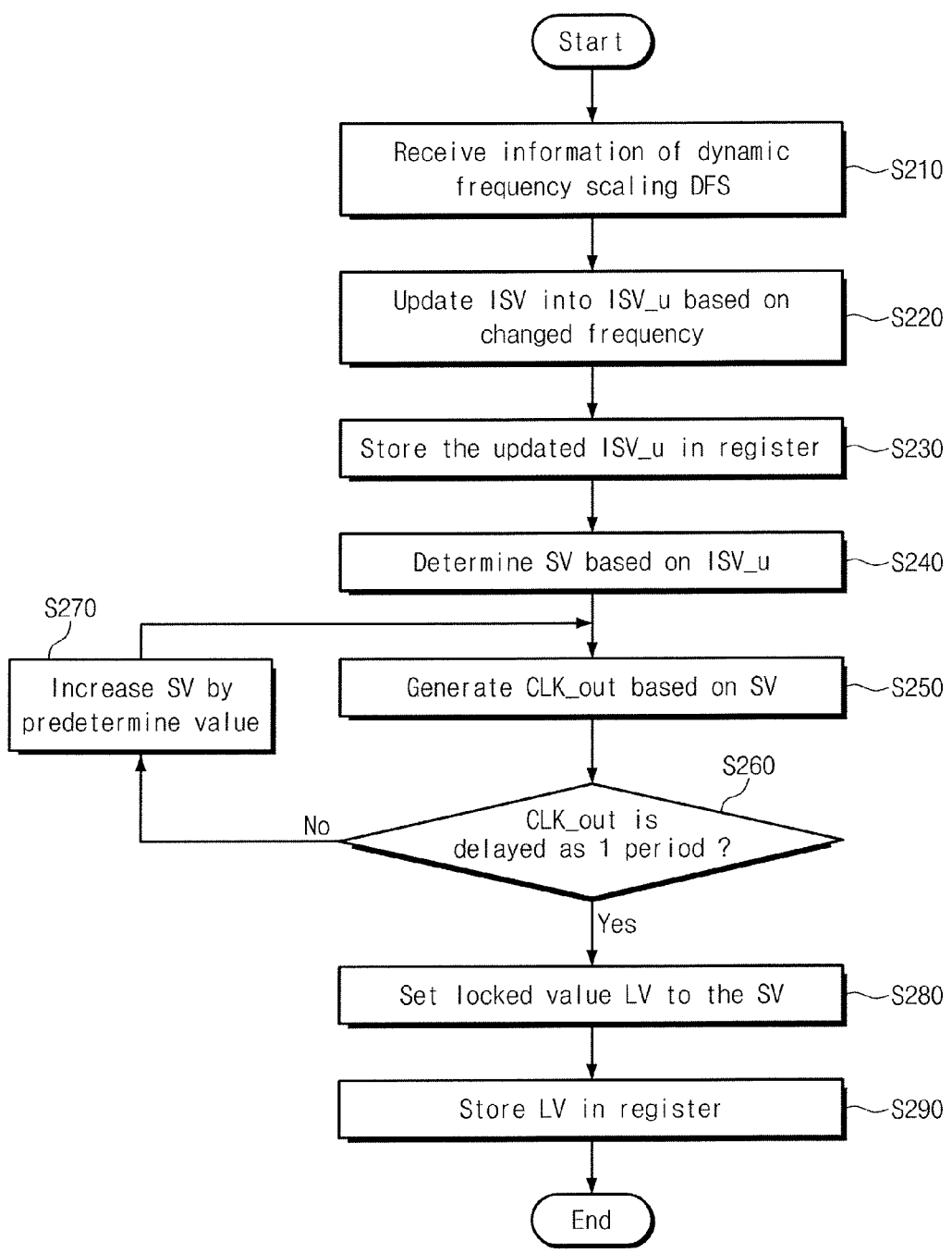
FIG. 13 is a flow chart illustrating an operation of a DLL illustrated in FIG. 12 in accordance with an exemplary embodiment of the present inventive concept.

FIG. 13 is a flow chart illustrating an operation of a DLL illustrated in FIG. 12. Referring to FIGS. 12 and 13, in a step S210, the DLL 2110 may receive DFS information. For example, the DLL 2110 may operate based on the input clock CLK_in having the first frequency FQ1. The DLL 2110 may include a locked value LV with respect to the input clock CLK_in. The locked value LV may be stored in the DLL controller 2115.

A frequency of the input clock CLK_in may be controlled to have the second frequency FQ2 by DFS operation. In this case, the DLL 2110 may receive the DFS information. The DFS information may be received from the DLL managing unit 1170 or the processor 1120 driving the DLL managing unit 1170. The DFS information may include the changed frequency information, for example, information about the change from the first frequency FQ1 to the second frequency FQ2, of the input clock CLK_in.

In a step S220, the DLL 2110 may update the initial select value IVS on the basis of the changed frequency information. For example, the DLL 2110 may update the initial select value IVS on the basis of the changed frequency information and the locked value LV with respect to the input clock before being adjusted. The initial select value ISV_u is updated according to mathematical formula 1.

In a step S230, the DLL 2110 may store the updated initial select value ISV_u in a storage circuit. Since steps S240 through S290 are the same as the steps S120 through S170, overlapping descriptions will be omitted.

In an exemplary embodiment of the present inventive concept, the DLL 2110 may store the updated initial select values ISV_u corresponding to frequencies (e.g., the first and second frequencies FQ1 and FQ2) of the input clocks CLK_in in a storage circuit. In addition, in the case that DFS operation is performed, the DLL 2110 may generate an output clock CLK_out on the basis of the updated initial select values IVS_u stored in the storage circuit.

According to an exemplary embodiment of the present inventive concept, in the case that a frequency of the input clock CLK_in is changed, the DLL 2110 may update the initial select value ISV on the basis of the changed frequency information. The DLL 2110 may perform a seeking operation on the basis of the updated initial select value ISV_u and thus, a seeking time for generating an output clock CLK_out may be reduced when a frequency of the input clock CLK_in is changed. Accordingly, a DLL having increased performance and a nonvolatile memory system including the DLL are provided.

Figure 14:
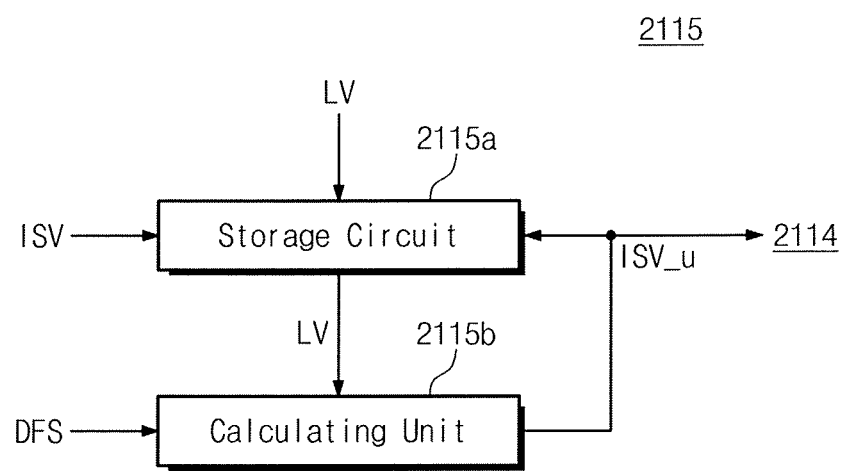
FIG. 14 is a block diagram illustrating a DLL controller illustrated in FIG. 12 in accordance with an exemplary embodiment of the present inventive concept.

FIG. 14 is a block diagram illustrating a DLL controller illustrated in FIG. 12. For brevity of description, unnecessary elements for explaining an operation of updating the initial select value ISV of the DLL controller 2115 will be omitted.

Referring to FIGS. 12 and 14, the DLL controller 2115 includes a storage circuit 2115a and a calculating unit 2115b. The storage circuit 2115a may store information (e.g., the initial select value ISV, the locked value LV, the updated initial select value ISV_u, or the like) to be used when the DLL 2110 operates. The storage circuit 2115a may be provided as a register, a fuse, etc.

The calculating unit 2115b may receive DFS information. The calculating unit 2115b may calculate the updated initial select value ISV_u on the basis of the received DFS information. For example, a frequency of the input clock CLK_in may be changed when the DLL 2110 or the nonvolatile memory system 1000 operates. In this case, the calculating unit 2115b may receive the DFS information. The DFS information may include the changed frequency information of the input clock CLK_in. The calculating unit 2115b may calculate the updated initial select value ISV_u on the basis of the locked value LV and the changed frequency information that are stored in the storage circuit 2115a, and the mathematical formula 1. The updated initial select value ISV_u may be stored in the storage circuit 2115a. The updated initial select value ISV_u may be transmitted to the delay line control unit 2114.

The delay line control unit 2114 may determine a select value SV on the basis of the updated initial select value ISV_u and then may perform a locking operation or seeking operation.

Figure 15:
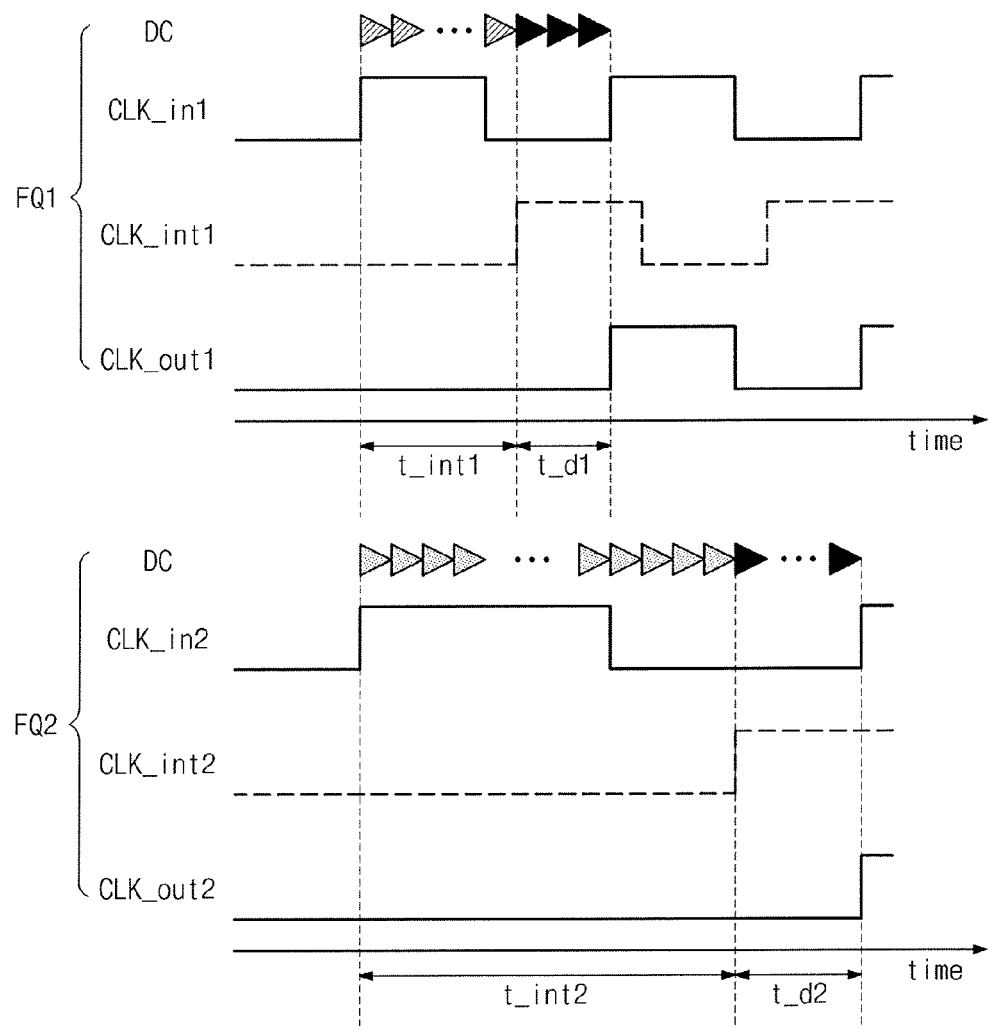
FIG. 15 is a diagram for explaining an operation of a DLL in accordance with an exemplary embodiment of the present inventive concept.

FIG. 15 is a diagram for explaining an operation of a DLL accordance with an exemplary embodiment of the present inventive concept. Referring to FIGS. 12 and 15, the DLL 2110 may delay a first input clock CLK_in1 having a first frequency FQ1 by n periods (e.g., one period) to output a first output clock CLK_out1.

The DLL 2110 may generate the first output clock CLK_out1 on the basis of the operation described with reference to FIGS. 6 through 9. For example, the DLL 2110 may receive an initial select value ISV and may delay the first input clock CLK_in1 on the basis of the received initial select value ISV to generate a first initial delay clock CLK_int1. The first initial delay clock CLK_int1 is a clock delayed by a first initial delay time t_int1 with respect to the first input clock CLK_in1. In addition, the DLL 2110 may generate the first output clock CLK_out1 by performing a seeking operation. In this case, the first initial delay clock CLK_int1 and the first output clock CLK_out1 may have a phase difference of a first delay time t_d1.

The DLL 2110 may store a locked value LV in the storage circuit 2115a for generating the first output clock CLK_out1.

In addition, the DLL 2110 may operate based on a second input clock CLK_in2 having a second frequency FQ2. For example, a frequency of the input clock may be changed. The DLL 2110 may receive DFS information and update the initial select value ISV on the basis of the DFS information and the locked value LV as described with reference to FIG. 14. For example, the second frequency FQ2 may be half of the first frequency FQ1. In this case, the DLL 2110 updates (e.g., increases) the initial select value ISV according to the mathematical formula 1.

In addition, the DLL 2110 may generate a second initial delay clock CLK_int2 on the basis of the updated initial select value ISV_u. In addition, the DLL 2110 may generate a second output clock CLK_out2 by performing a seeking operation as described with reference to FIGS. 6 through 9.

The second initial delay clock CLK_int2 may be a clock delayed based on the updated initial select value ISV_u with respect to the second input clock CLK_in2. The initial select value ISV_u may be updated on the basis of the locked value LV. The locked value LV corresponds to the number of delay cells to be activated with respect to the first input clock CLK_in1. In this case, the locked value LV is a value to which an operation condition with respect to a PVT (process, voltage, temperature) variation of the DLL 2110 is applied. Thus, the operation condition with respect to the PVT variation of the DLL 2110 may be applied to the updated initial select value ISV_u.

The second output clock CLK_out2 is a clock delayed by a second delay time t_d2 with respect to the second initial delay clock CLK_int2. The second delay time t_d2 is smaller than the second delay time t_d2 illustrated in FIG. 11. In the DLL 2110, in the case that a frequency of the input clock CLK_in is changed, a seeking time for generating the output clock CLK_out is reduced by updating the initial select value ISV according to the frequency change of the input clock CLK_in. As the seeking time is reduced, power consumption of the DLL 2110 may be reduced. Thus, a DLL having increased performance and reduced power consumption, and a nonvolatile memory system including the DLL are provided.

Figure 16:
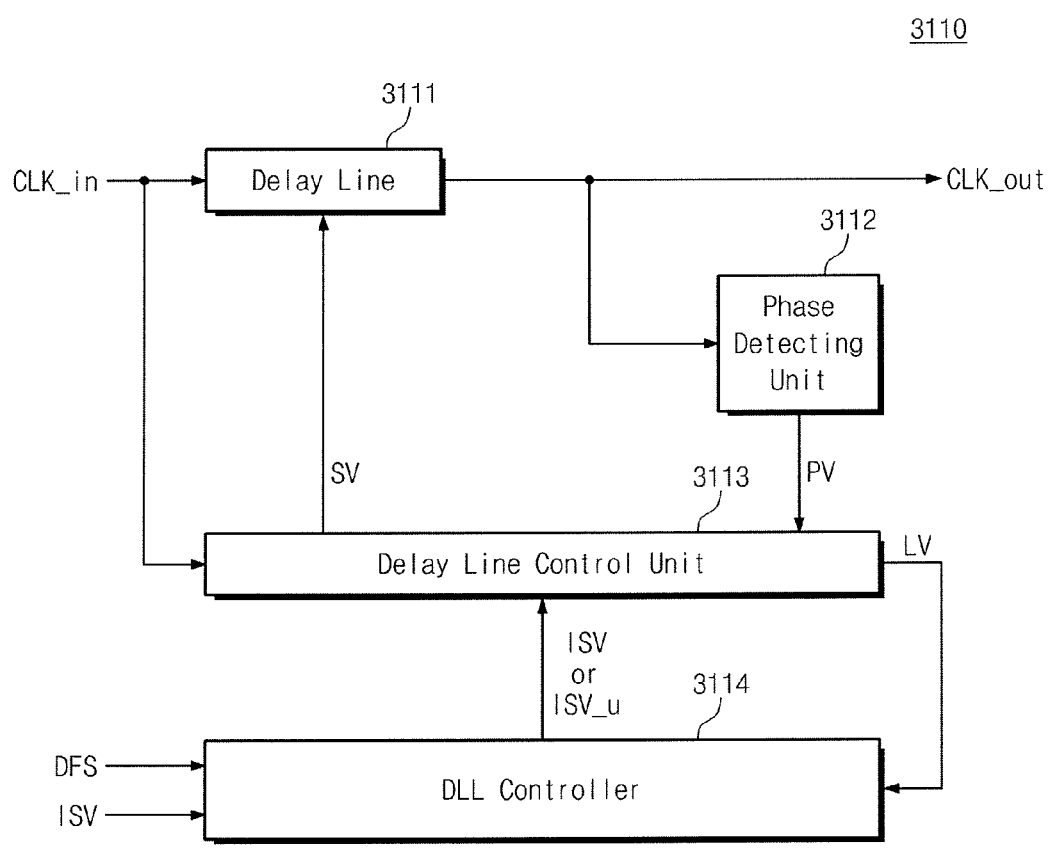
FIG. 16 is a block diagram illustrating a DLL in accordance with an exemplary embodiment of the present inventive concept.

FIG. 16 is a block diagram illustrating a DLL in accordance with an exemplary embodiment of the present inventive concept. Referring to FIG. 16, a DLL 3110 includes a delay line 3111, a phase detecting unit 3112, a delay line control unit 3113, and a DLL controller 3114.

Since the phase detecting unit 3112, the delay line control unit 3113, and the DLL controller 3114 are described with reference to FIG. 3, overlapping descriptions will be omitted. The delay line 3111 may perform the same operation as the first and second delay lines 1111 and 1112 described with reference to FIG. 3. The DLL 3110 may generate an output clock CLK_out using the delay line 3111.

Figure 17:
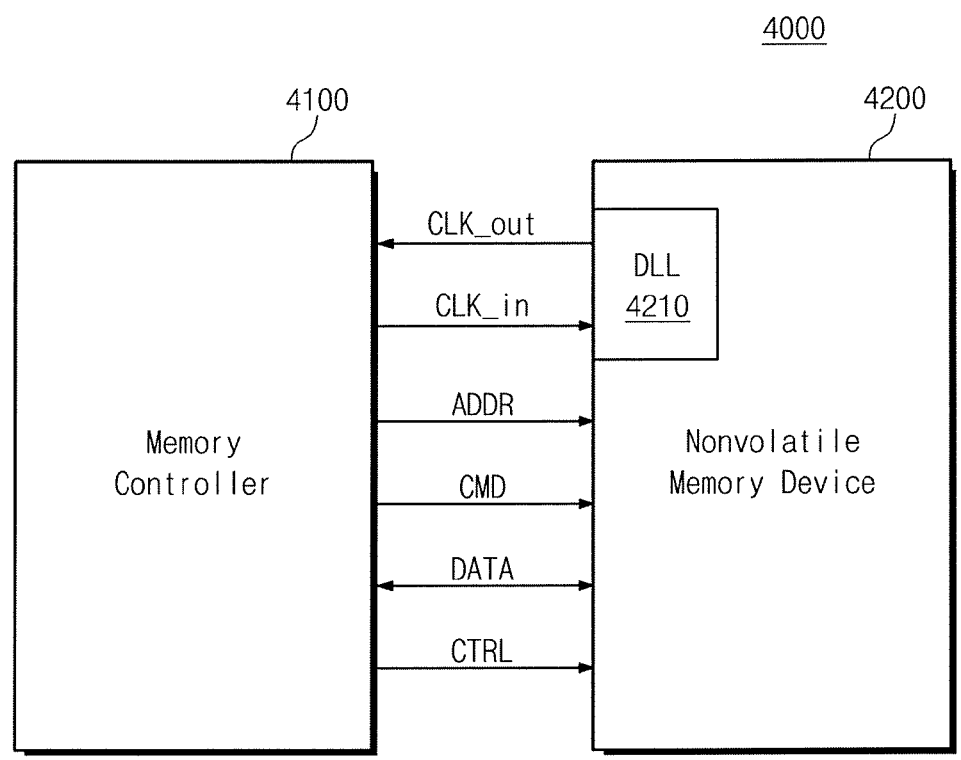
FIG. 17 is a block diagram illustrating a nonvolatile memory system in accordance with an exemplary embodiment of the present inventive concept.

FIG. 17 is a block diagram illustrating a nonvolatile memory system in accordance with an exemplary embodiment of the present inventive concept. Referring to FIG. 17, a nonvolatile memory 4000 includes a memory controller 4100 and a nonvolatile memory device 4200. Since the memory controller 4100 and the nonvolatile memory device 4200 are described with reference to FIG. 1, overlapping descriptions will be omitted.

Unlike the nonvolatile memory device 1200 of FIG. 1, the nonvolatile memory device 4200 of FIG. 17 includes a DLL 4210. The memory controller 4100 may transmit an input clock CLK_in to the DLL 4210. The DLL 4210 may receive the input clock CLK_in and generate an output clock CLK_out by delaying the received input clock CLK_in by n period (e.g., one period). The output clock CLK_out may be transmitted to the memory controller 4100. For example, the output clock CLK_out may be used as a data strobe signal DQS of the nonvolatile memory system 4000.

The nonvolatile memory system 4000 may support a DFS operation. The DLL 4210 may operate based on the method described with reference to FIGS. 1 through 15.

According to an exemplary embodiment of the present inventive concept, the nonvolatile memory device 4200 includes the DLL 4210. When a frequency of the input clock CLK_in is changed, the DLL 4210 may reduce a locking time of the DLL 4210 by updating an initial select value ISV. Thus, a DLL having increased performance and a nonvolatile memory system including the same may be provided.

Figure 18:
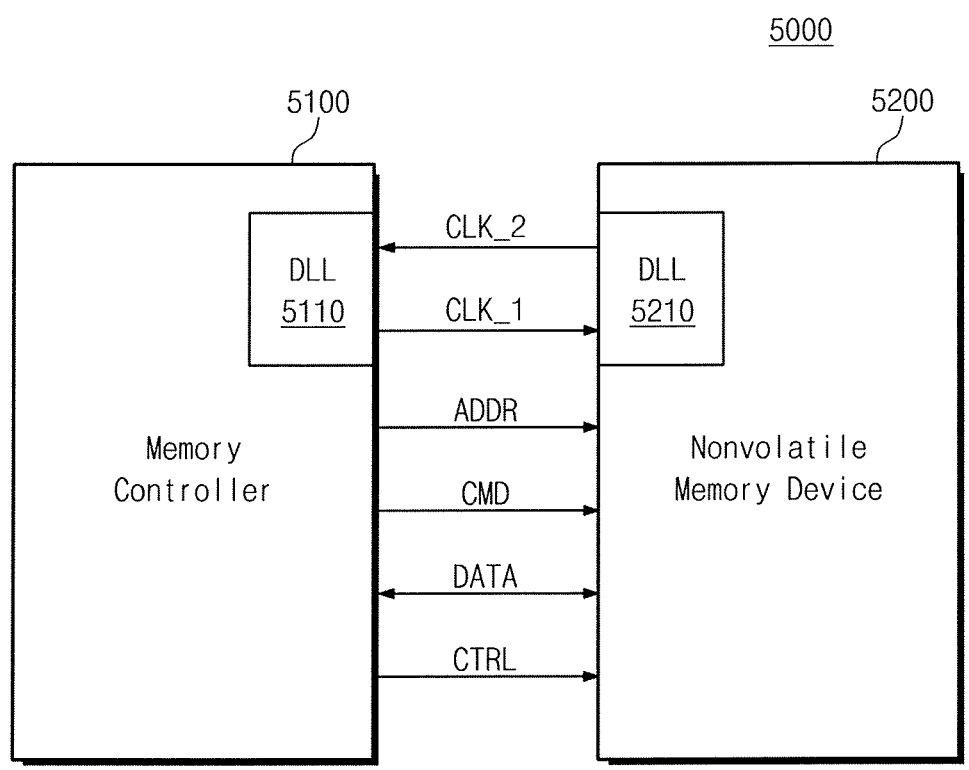
FIG. 18 is a block diagram illustrating a nonvolatile memory system in accordance with an exemplary embodiment of the present inventive concept.

FIG. 18 is a block diagram illustrating a nonvolatile memory system in accordance with an exemplary embodiment of the present inventive concept. Referring to FIG. 18, a nonvolatile memory 5000 includes a memory controller 5100 and a nonvolatile memory device 5200. Since the memory controller 5100 and the nonvolatile memory device 5200 are described with reference to FIGS. 1 and 17, overlapping descriptions will be omitted.

The memory controller 5100 and the nonvolatile memory device 4200 may include a DLL 5110 and a DLL 5210, respectively. The DLL 5110 may generate a first clock CLK_1 on the basis of an internal clock or an operation clock to be used in the memory controller 5100 and transmit the generated first clock CLK_1 to the nonvolatile memory device 5200. The DLL 5210 receives the first clock CLK_1, generates a second clock CLK_2 on the basis of the received first clock CLK_1, and transmits the generated second clock CLK_2 to the memory controller 5100.

The nonvolatile memory system 5000 may support a DFS operation. In the case that an internal clock or an operation clock of the nonvolatile memory system 5000 is adjusted, the DLLs 5110 and 5210 may operate based on the method described with reference to FIGS. 1 through 15. The first or second clock CLK_1 or CLK_2 may be used as a data strobe signal DQS of the nonvolatile memory system 5000. A signal generated by delaying the first or second clock CLK_1 or CLK_2 using the DLL 5110 or 5210 may be used as a data strobe signal DQS of the nonvolatile memory system 5000.

Figure 19:
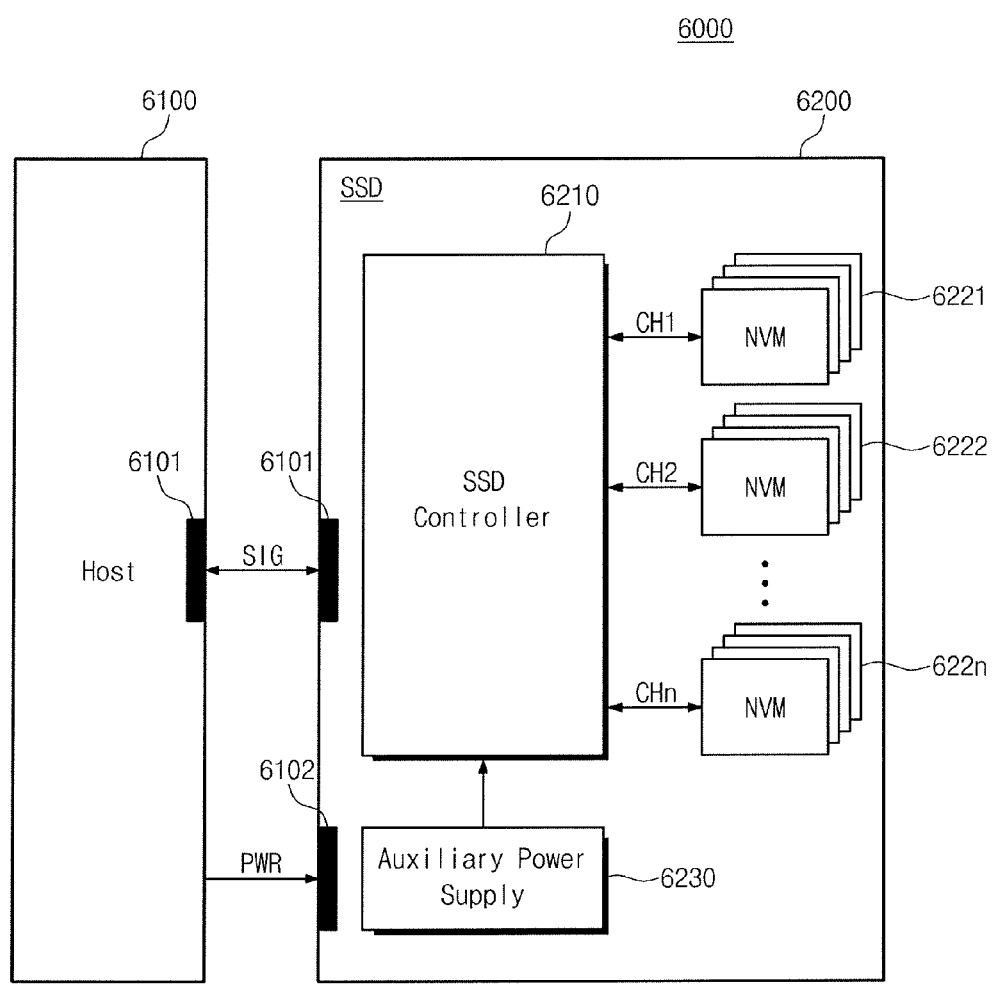
FIG. 19 is a block diagram illustrating a solid state drive (SSD) system to which a nonvolatile memory system in accordance with an exemplary embodiment of the present inventive concept is applied.

FIG. 19 is a block diagram illustrating a solid state drive SSD system to which a nonvolatile memory system in accordance with an exemplary embodiment of the present inventive concept is applied. Referring to FIG. 19, a SSD system 6000 includes a host 6100 and a SSD 6200.

The host 6100 writes data in the SSD 6200 or reads data stored in the SSD 6200. The host 6100 may exchange a signal SGL such as a command, an address, state information, etc. with the SSD 6200 through a host interface 6101. The host interface 6101 may include various interfaces such as a USB, a MMC (multimedia card), a PCI, a PCI-E, an ATA, a serial-ATA, a parallel-ATA, a SCSI, an ESDI, an IDE, a MIPI (mobile industry processor interface), a NVMe, etc.

The SSD 6200 exchanges a signal SGL with the host 6100 through the host interface 6101. The SSD 6200 is supplied with power through a power connector 6102. The SSD 6200 may include a plurality of nonvolatile memories 6221~622n, a SSD controller 6210, and an auxiliary power supply 6230. The nonvolatile memories 6221~622n may be embodied by a phase change random-access memory (PRAM), a magnetic random-access memory (MRAM), a resistive random-access memory (ReRAM), a ferroelectric random-access memory (FRAM), etc. besides a NAND flash memory.

The nonvolatile memories 6221~622n are used as a storage medium of the SSD 6200. The nonvolatile memories 6221~622n may be connected to the SSD controller 6210 through a plurality of channels CH1~CHn. One or more nonvolatile memory devices may be connected to each of the plurality of channels CH1~CHn. Nonvolatile memory devices connected to each channel may be connected to a same data bus.

The SSD controller 6210 exchanges a signal SGL with the host 6100 through the host interface 6201. The signal SGL includes a command, an address, data, etc. The SSD controller 6210 writes data in a corresponding nonvolatile memory device or reads data from a corresponding nonvolatile memory device according to a command of the host 6100.

The auxiliary power supply 6230 is connected to the host 6100 through the power connector 6202. The auxiliary power supply 6230 may be supplied with power from the host 6100 and may be charged. The auxiliary power supply 6230 may be located inside or outside the SSD 6200. For example, the auxiliary power supply 6230 is located on a main board and may provide auxiliary power to the SSD 6200.

The SSD 6200 may support DFS operation. The host interface 6101 may include a DLL. The SSD controller 6210 and a plurality of memory devices 6221~622n may include the DLL. The DLL may operate based on the method described with reference to FIGS. 1 through 15. Thus, since a seeking time of the DLL is reduced when the operation clock or an internal clock of the SSD 6200 is changed, and a SSD system having increased performance is provided.

Figure 20:
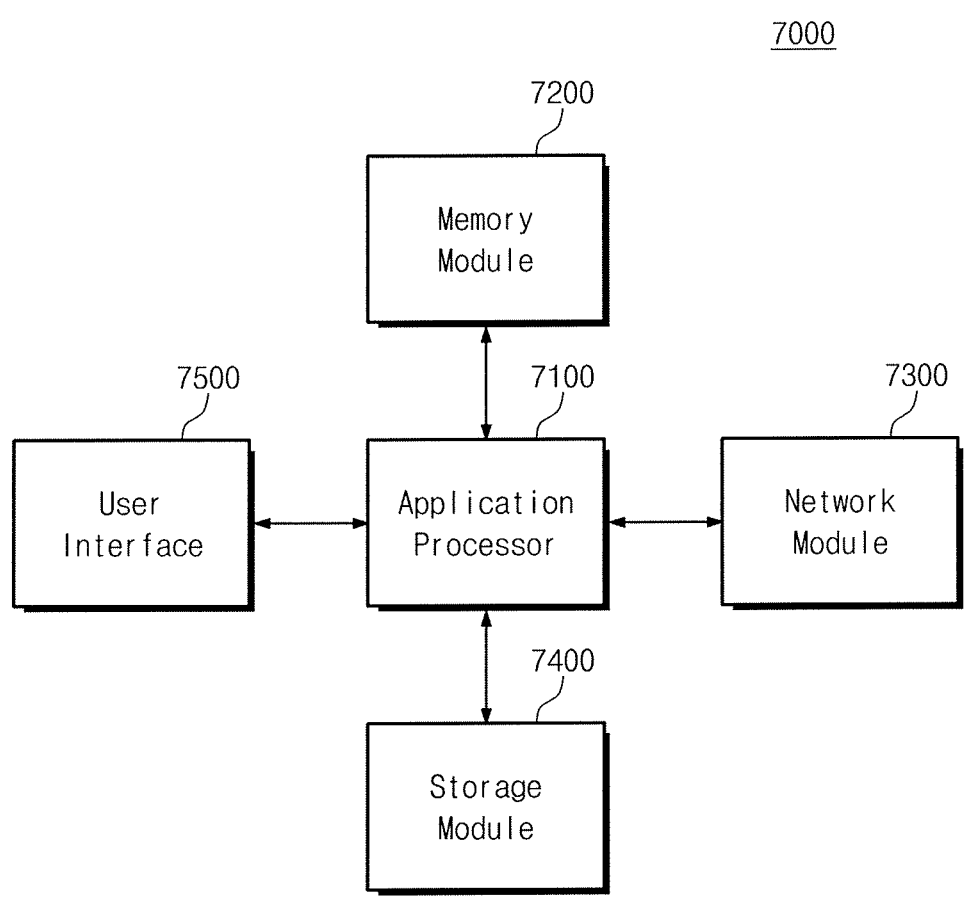
FIG. 20 is a block diagram illustrating a user system to which a memory system in accordance with an exemplary embodiment of the present inventive concept is applied.

FIG. 20 is a block diagram illustrating a user system to which a memory system in accordance with an exemplary embodiment of the present inventive concept is applied. Referring to FIG. 20, a user system 7000 includes an application processor 7100, a memory module 7200, a network module 7300, a storage module 7400, and a user interface 7500. The user system 7000 may be provided as one of computing systems such as an ultra mobile personal computer (UMPC), a workstation, a net-book, a personal digital assistant (PDA), a web tablet, a wireless phone, a mobile phone, a smart phone, an e-book, a portable multimedia player (PMP), a portable game machine, a navigation device, a black box, a digital camera, a digital multimedia broadcasting (DMB) player, a digital audio recorder, a digital audio player, a digital picture recorder, a digital picture player, a digital video recorder, a digital video player, etc.

The application processor 7100 may drive constituent elements included in the user system 7000 and an operating system. The application processor 7100 may include controllers for controlling constituent elements included in the user system 7000, various interfaces, and a graphic engine.

The memory module 7200 may function as a main memory, an operation memory, a buffer memory, or a cache memory of the user system 7000. The memory module 7200 may include a volatile random access memory such as dynamic random-access memory (DRAM), synchronous DRAM (SDRAM), DDR SDRAM, DDR2 SDRAM, DDR3 SDRAM, low power double data rate (LPDDR) DRAM, LPDDR2 DRAM, LPDDR3 DRAM, etc. and a nonvolatile random access memory such as PRAM, ReRAM, MRAM, FRAM, etc.

The network module 7300 may communicate with external devices. The network module 7300 may support a wireless communication such as CDMA (Code Division Multiple Access), GSM (Global System for Mobile communication), WCDMA (wideband CDMA), CDMA-2000, TDMA (Time Division Multiple Access), LTE (Long Term Evolution), WiMAX (Worldwide Interoperability for Microwave Access), WLAN (Wireless Local Area Network), UWB (Ultra-Wide Band), Bluetooth, WI-DI (Wireless Display), etc. In an exemplary embodiment of the present inventive concept, the network module 7300 may be embedded in the application processor 7100.

The storage module 7400 may store data. For example, the storage module 7400 may store data received from the outside. The storage module 7400 may transmit data stored in the storage module 7400 to the application processor 7100. The storage module 7400 may be embodied by a semiconductor memory device such as a PRAM, a MRAM, a RRAM, a NAND flash, a NOR flash, a NAND flash having a three-dimensional structure, etc.

The user interface 7500 may include interfaces that may input data or a command in the user system 7000 or output data to an external device. The user interface 7500 may include input devices such as a camera, a touch screen, an operation recognition module, a microphone, etc. or output devices such as a display, a speaker, a touch screen, etc.

The storage module 7400 may support a DFS operation. The storage module 7400 may include a memory controller and a plurality of nonvolatile memory devices. The memory controller and/or the nonvolatile memory devices may include a DLL. The mobile system 7000 may support aDFS operation. Each of the application processor 7100, the memory module 7200, the network module 7300, the storage module 7400, and the user interface 7500 may include a DLL. The DLL may operate based on the method described with reference to FIGS. 1 through 15. Thus, a user system having increased performance is provided.

According to an exemplary embodiment of the present inventive concept, the DLL delays an input clock CLK_in by n periods (e.g., one period) to output an output clock CLK_out. In this case, to delay the input clock CLK_in by n periods (e.g., one period), the DLL performs a search operation on the basis of an initial select value ISV. In the case that a frequency of the input clock CLK_in is changed, the DLL updates the initial select value ISV on the basis of the changed frequency information and performs a search operation on the basis of an updated initial select value ISV_u. Thus, since a search time of the DLL is reduced, a DLL having increased performance and a nonvolatile memory system including the DLL are provided.

According to an exemplary embodiment of the present inventive concept, a search time of a DLL may be reduced by updating an initial select value when a frequency of an input clock to the DLL is adjusted. Thus, a DLL having increased performance and reduced power consumption and a method of operating the DLL are provided.

Although the present inventive concept has been shown and described with reference to exemplary embodiments thereof, it will be understood by those skilled in the art that various changes in forms and details may be made therein without departing from the spirit and scope of the present inventive concept as defined in the appended claims.

What is claimed is:

1. A delay locked loop comprising:
    a delay line configured to output an output clock by delaying an input clock by a first time on the basis of a select value;
    a phase detector configured to detect a phase of the output clock;
    a delay line control unit configured to determine the select value so that the first time corresponds to n periods of the input clock on the basis of the detected phase and an initial select value, wherein n is a positive integer; and
    a delay locked loop controller configured to provide the initial select value to the delay line control unit,
    wherein the delay locked loop controller is configured to update the initial select value according to a change of a frequency of the input clock, and to provide the updated initial select value to the delay line control unit, and
    wherein the delay line control unit is configured to determine the select value on the basis of the updated initial select value.

2. The delay locked loop of claim 1, wherein the delay line control unit is configured to change the select value when the first time does not correspond to the n periods of the input clock.

3. The delay locked loop of claim 2, wherein the delay line is configured to delay the input clock on the basis of the changed select value, and to output the output clock.

4. The delay locked loop of claim 1, wherein the delay line control unit is configured to set the determined select value as a locked value, and to transmit the set locked value to the delay locked loop controller.

5. The delay locked loop of claim 4, wherein the delay locked loop controller comprises:
    a storage circuit configured to store the locked value and the initial select value; and
    a calculating unit configured to generate the updated initial select value according to the frequency change of the input clock and the locked value.

6. The delay locked loop of claim 5, wherein the updated initial select value is stored in the storage circuit.

7. The delay locked loop of claim 6, wherein the delay line control unit is configured to determine the select value on the basis of the updated initial select value in the storage circuit, the initial select value in the storage circuit, and the frequency of the input clock.

8. A method of operating a delay locked loop comprising:
    outputting a first output clock by delaying a first input clock having a first frequency by n periods of the first input clock on the basis of a first initial select value, wherein n is a positive integer;
    determining a second initial select value on the basis of the first frequency and a second frequency when the first input clock is changed to a second input clock having the second frequency; and
    outputting a second output clock by delaying the second input clock by m periods of the second input clock on the basis of the second initial select value, wherein m is a positive integer.

9. The method of claim 8, wherein the outputting a first output clock by delaying a first input clock comprises:
    setting the first initial select value to a first select value;
    outputting the first output clock on the basis of the set first select value;
    detecting a phase of the first output clock;
    adjusting the first select value so that a phase difference between the first input clock and the first output clock corresponds to the n periods of the first input clock on the basis of the detected phase; and
    outputting the first output clock on the basis of the adjusted first select value.

10. The method of claim 9, wherein the outputting a first output clock by delaying a first input clock further comprises:
setting the adjusted first select value to a first locked value; and
storing the set first locked value in a storage circuit.

11. The method of claim 10, wherein the determining a second initial select value on the basis of the first and second frequencies comprises determining the second initial select value on the basis of a ratio of the first and second frequencies and the first locked value.

12. The method of claim 10, wherein the determining a second initial select value on the basis of the first and second frequencies further comprises applying an offset value to the second initial select value so that a phase difference between the second output clock and the second input clock does not exceed one period of the second input clock.

13. The method of claim 11, wherein the second initial select value is determined to be greater than the first initial select value when the first frequency is higher than the second frequency, and the second initial select value is determined to be smaller than the first initial select value when the first frequency is lower than the second frequency.

14. The method of claim 11, wherein the determining a second initial select value on the basis of the first and second frequencies further comprises storing the second initial select value in the storage circuit.

15. The method of claim 8, wherein the outputting a second output clock by delaying a second input clock having the second frequency comprises:
setting the second initial select value to a second select value;
outputting the second output clock on the basis of the set second select value;
detecting a phase of the second output clock;
adjusting the second select value so that a phase difference between the second input clock and the second output clock corresponds to the m periods of the second input clock on the basis of the detected phase; and
outputting the second output clock on the basis of the adjusted second select value.

16. A memory system comprising:
a memory device configured to store data; and
a memory controller configured to control the memory device,
wherein the memory controller includes a first delay locked loop, and the memory device includes a second delay locked loop,
wherein the first delay locked loop is configured to generate a first clock, and to transmit the first clock to the memory device,
wherein the second delay locked loop is configured to receive the first clock, to generate a second clock on the basis of the received first clock, and to transmit the second clock to the memory controller,
wherein at least one of the first and second delay locked loops comprises:
a delay line configured to output an output clock by delaying an input clock by a first time on the basis of a select value;
a delay line control unit configured to determine whether the first time corresponds to n periods of the input clock, and to provide the select value to the delay line on the basis of an initial select value, wherein n is a positive integer; and
a delay locked loop controller configured to provide the initial select value to the delay line control unit,
wherein the delay locked loop controller is configured to update the initial select value when a frequency of the input clock is changed from a first frequency to a second frequency, and to provide the updated initial select value to the delay line control unit, and
wherein the delay line control unit is configured to determine the select value on the basis of the updated initial select value.

17. The system of claim 16, wherein the delay line control unit is configured to set the select value as a locked value and to provide the locked value to the delay locked loop controller when the first time is determined to be the n periods of the input clock, and
wherein the delay line control unit is configured to adjust the select value when the first time is determined to be different from the n periods of the input clock.

18. The system of claim 16, wherein the delay line comprises a plurality of delay cells configured to activate based on the select value,
wherein the input clock is delayed by the activated delay cells.

19. The system of claim 18, wherein the delay locked loop controller is configured to update the initial select value on the basis of a ratio of the first and second frequencies.

20. The system of claim 18, wherein the delay locked loop controller is configured to increase the initial select value when the first frequency is higher than the second frequency, and
wherein the delay locked loop controller is configured to decrease the initial select value when the first frequency is lower than the second frequency.

* * * * *